US007389569B2

(12) United States Patent
Shiraishi et al.

(10) Patent No.: US 7,389,569 B2
(45) Date of Patent: Jun. 24, 2008

(54) METHOD FOR MANFACTURING AN ACOUSTIC MATCHING MEMBER

(75) Inventors: Seigo Shiraishi, Neyagawa (JP); Norihisa Takahara, Ibaraki (JP); Masaaki Suzuki, Osaka (JP); Kazuhiko Hashimoto, Moriguchi (JP); Takashi Hashida, Osaka (JP); Hidetomo Nagahara, Soraku-gun (JP); Masahiko Hashimoto, Shijonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 10/757,829

(22) Filed: Jan. 14, 2004

(65) Prior Publication Data

US 2004/0144181 A1 Jul. 29, 2004

Related U.S. Application Data

(62) Division of application No. 10/434,516, filed on May 7, 2003, now Pat. No. 6,788,620.

(30) Foreign Application Priority Data

May 15, 2002 (JP) ............................ 2002-140687

(51) Int. Cl.
*H01L 41/22* (2006.01)
*H01L 41/00* (2006.01)

(52) U.S. Cl. .......................... 29/25.35; 29/594; 29/595; 29/832; 29/846; 29/852; 310/334

(58) Field of Classification Search .................. 29/852, 29/846, 594, 25.35, 595, 832; 310/334, 336, 310/152, 162, 34, 335, 327; 73/810, 861, 73/18, 27, 601, 801, 861.18, 861.27; 501/80; 516/33

See application file for complete search history.

(56) References Cited

U.S. PATENT DOCUMENTS 2,762,724 A * 9/1956 Brennan ...................... 428/68

(Continued)

FOREIGN PATENT DOCUMENTS

| | | |
|---|---|---|
| GB | 2 225 426 | 5/1990 |
| JP | 61-169100 | 7/1986 |
| JP | 6-86397 | 3/1994 |
| JP | 2559144 | 9/1996 |

OTHER PUBLICATIONS

Ultrasonic Waves Handbook Editorial Committee(ed), 1990, "Ultrasonic Waves Handbook", Maruzen, Tokyo, pp. 108, 109, 114-117 (with partial translation).

*Primary Examiner*—A. Dexter Tugbang
*Assistant Examiner*—Tai Nguyen
(74) *Attorney, Agent, or Firm*—Hamre, Schumann, Mueller & Larson, P.C.

(57) ABSTRACT

A method for manufacturing an acoustic matching member, the acoustic matching member being incorporated into an ultrasonic transducer for transmitting and receiving ultrasonic waves, and including: at least two layers including a first layer and a second layer that have different acoustic impedance values from each other. The method for manufacturing including the steps of: filling voids of a porous member with a fluid filling material, and solidifying both the fluid filling material inside the voids and the surplus fluid filling material at the same time. The acoustic matching member does not have independent intermediate layers between the layers, so that delamination hardly occurs and the difficulty in the designing associated with the presence of intermediate layers can be avoided.

6 Claims, 16 Drawing Sheets

U.S. PATENT DOCUMENTS 3,738,169 A 6/1973 Courty
3,840,407 A * 10/1974 Yao et al. ...................... 429/27
3,964,308 A 6/1976 Scarpa
4,366,406 A 12/1982 Smith et al.
4,523,122 A * 6/1985 Tone et al. .................. 310/334
4,579,658 A * 4/1986 Moller ....................... 210/483
4,588,443 A * 5/1986 Bache ........................ 106/644
4,640,866 A * 2/1987 Suzuki ....................... 428/422
5,086,373 A * 2/1992 Kurabayashi et al. ....... 361/502
5,114,803 A * 5/1992 Ishihara et al. ................ 429/30
5,242,652 A * 9/1993 Savigny ...................... 264/510
5,327,895 A * 7/1994 Hashimoto et al. .......... 310/334
5,625,149 A * 4/1997 Gururaja et al. ............... 73/632
5,648,941 A * 7/1997 King .......................... 367/176
5,688,728 A * 11/1997 Niwa et al. ................... 501/80
5,785,787 A * 7/1998 Wojnarowski et al. ...... 156/155
5,792,058 A * 8/1998 Lee et al. .................... 600/459
5,817,408 A * 10/1998 Orimo et al. ................ 428/218
5,948,482 A * 9/1999 Brinker et al. ................ 516/33
6,297,459 B1 * 10/2001 Wojnarowski et al. ...... 174/255
6,371,915 B1 4/2002 Koger et al.
6,545,947 B1 4/2003 Morozumi et al.

* cited by examiner

1

5
3

1
5
3

21
8
5
3

201
100
3
5

METHOD FOR MANFACTURING AN ACOUSTIC MATCHING MEMBER

BACKGROUND OF THE INVENTION

1. Field of the Invention

The present invention relates to an acoustic matching member used for an acoustic matching layer of an ultrasonic sensor, an ultrasonic transducer for transmitting/receiving ultrasonic waves, a method for manufacturing them, and an ultrasonic flowmeter using them.

2. Related Background Art

In recent years, an ultrasonic flowmeter has been used as a gas meter and the like, where a time for ultrasonic waves to propagate through a propagation path and a velocity of fluid moving therein are measured so as to determine a flow rate of the fluid. FIG. 13 shows the principles of measurement by the ultrasonic flowmeter. As shown in FIG. 13, within a measurement tube including a flow path, fluid flows at a velocity of V in the direction shown by the arrow in the drawing. In a tube wall 103, a pair of ultrasonic transducers 101 and 102 is disposed so as to oppose each other. The ultrasonic transducers 101 and 102 are configured with a piezoelectric vibrator such as a piezoelectric ceramic functioning as an electric/mechanical energy transducer, and therefore exhibit resonant characteristics like a piezobuzzer and a piezoelectric oscillator. In this case, the ultrasonic transducer 101 is used as an ultrasonic transmitter and the ultrasonic transducer 102 is used as an ultrasonic receiver.

These ultrasonic transducers operate as follows: when an AC voltage at a frequency dose to a resonant frequency of the ultrasonic transducer 101 is applied to the piezoelectric vibrator, the ultrasonic transducer 101 operates as an ultrasonic transmitter so as to emit ultrasonic waves to a propagation path in the fluid flowing in the tube, which is indicated by L1 in the drawing, and the ultrasonic transducer 102 receives the ultrasonic waves that have propagated and converts them to voltage. Subsequently, the ultrasonic transducer 102 conversely is used as an ultrasonic transmitter and the ultrasonic transducer 101 is used as an ultrasonic receiver. That is, by applying an AC voltage at a frequency dose to a resonant frequency of the ultrasonic transducer 102 to the piezoelectric vibrator, the ultrasonic transducer 102 emits ultrasonic waves to a propagation path in the fluid flowing in the tube, which is indicated by L2 in the drawing, and the ultrasonic transducer 101 receives the ultrasonic waves that have propagated and converts them to voltage. In this way, each of the ultrasonic transducers 101 and 102 serves as the receiver and the transmitter, and therefore, in general, they are called an ultrasonic transmitter/receiver.

In such an ultrasonic flowmeter, the continuous application of an AC voltage results in the continuous emission of ultrasonic waves from the ultrasonic transducer, which makes it difficult to measure the propagation time. Therefore, normally, a burst voltage signal is used as a driving voltage, where a pulse signal is used as a carrier wave. A more detailed description of the measurement principles will be given below. By applying a burst voltage signal to drive the ultrasonic transducer 101 and allow the ultrasonic transducer 101 to emit an ultrasonic burst signal, this ultrasonic burst signal propagates through a propagation path L1 with a length of L to arrive at the ultrasonic transducer 102 after the time t has elapsed. The ultrasonic transducer 102 can convert the ultrasonic burst signal that has propagated only into an electric burst signal at a high S/N ratio. This electric burst signal is amplified electrically and is applied again to the ultrasonic transducer 101 to allow an ultrasonic burst signal to be emitted. This device is called a sing around device. A time required for an ultrasonic pulse to be emitted from the ultrasonic transducer 101 and propagate through the propagation path to arrive at the ultrasonic transducer 102 is called a sing around period, and the reciprocal of the sing around period is called a sing around frequency.

In FIG. 13, V denotes a flow velocity of fluid that flows through the tube, C (not illustrated) denotes a velocity of an ultrasonic wave in the fluid and θ denotes an angle between the flowing direction of the fluid and the propagation direction of the ultrasonic pulse. When the ultrasonic transducer 101 is used as an ultrasonic transmitter and the ultrasonic transducer 102 is used as an ultrasonic receiver, the following formula (1) will be satisfied, where t1 denotes a sing around period that is a time for an ultrasonic pulse emitted from the ultrasonic transducer 101 to arrive at the ultrasonic transducer 102, and f1 denotes a sing around frequency:

$$f1=1/t1=(C+V\cos\theta)/L \quad (1)$$

Conversely, when the ultrasonic transducer 102 is used as an ultrasonic transmitter and the ultrasonic transducer 101 is used as an ultrasonic receiver, the following formula (2) will be satisfied, where t2 denotes a sing around period and f2 denotes a sing around frequency:

$$f2=1/t2=(C-V\cos\theta)/L \quad (2)$$

Therefore, a frequency difference Δf between the both sing around frequencies will be the following formula (3), so that the flow velocity V of the fluid can be determined from the length L of the propagation path of ultrasonic waves and the frequency difference Δf:

$$\Delta f=f1-f2=2V\cos\theta/L \quad (3)$$

That is to say, the flow velocity V of the fluid can be determined from the length L of the propagation path of ultrasonic waves and the frequency difference Δf, and a flow rate can be determined from the velocity V.

Such an ultrasonic flowmeter requires high accuracy. In order to improve the accuracy, an acoustic impedance of an acoustic matching layer becomes important, where the acoustic matching layer is formed on a surface for transmitting/receiving ultrasonic waves of the piezoelectric vibrator constituting the ultrasonic transducer for transmitting the ultrasonic waves to gas or receiving the ultrasonic waves that have propagated through gas.

FIG. 12 is a cross-sectional view showing a configuration of a conventional ultrasonic transducer 20. Reference numeral 10 denotes an acoustic matching layer functioning as an acoustic matching device, 5 denotes a sensor case, 4 denotes electrodes, and 3 denotes a piezoelectric member functioning as a vibration device. The sensor case 5 and the acoustic matching layer 10 or the sensor case 5 and the piezoelectric member 3 are bonded with an epoxy adhesive and the like. Reference numeral 7 of FIG. 12 denotes driving terminals, which are respectively connected to the electrodes 4 of the piezoelectric member 3. Reference numeral 6 denotes an insulation seal for securing electrical insulation of the two driving terminals. Ultrasonic waves generated from vibrations of the piezoelectric member 3 oscillate at a specific frequency, and the oscillation is conveyed to the case via the epoxy adhesive, and further is conveyed to the acoustic matching layer 10 via the epoxy adhesive. The matched oscillation propagates as an acoustic wave through gas as a medium that is present in the space.

This acoustic matching layer 10 has a role of allowing the vibrations of the vibration device to propagate effectively through the gas. The acoustic impedance Z will be defined as the following formula (4) using a sound velocity C and a density ρ of the substance:

$$Z=\rho\times C \quad (4)$$

The acoustic impedance is different significantly between the piezoelectric member as the vibration device and the gas as a medium to which ultrasonic waves are emitted (hereinafter called "emission medium"). For instance, the acoustic impedance of a piezo-ceramic such as PZT (lead zirconate titanate), which is a common piezoelectric member, is about $30\times10^6$ kg/m$^2$/s. Whereas, for the gas as the emission medium, the acoustic impedance (Z3) of air, for example, is about 400 kg/m$^2$/s. On a boundary surface between the substances with the thus different acoustic impedances, reflection occurs in the propagation of acoustic waves, so that the strength of the acoustic waves that have passed through there becomes weak. As a method for solving this, a substance is inserted between the piezoelectric member as the vibration device and the gas as the emission medium of ultrasonic waves, where the acoustic impedance of the inserted substance has a relationship shown by the formula (5) with the acoustic impedances Z0 and Z3 of the piezoelectric member and the gas, which is a commonly known method for improving the strength of the acoustic waves that pass through by alleviating the reflection of the sounds:

$$Z=(Z0\times Z3)^{(1/2)} \quad (5)$$

The optimum value satisfying this condition where the acoustic impedances are matched becomes about $11\times10^4$ kg/m$^2$/s. Substances that satisfy this acoustic impedance are required to be a solid having a small density and a low velocity of sound, as is understood from the formula (4). A material used generally is obtained by encapsulating a glass balloon or a plastic balloon in a resin material, which is then formed on a surface of an ultrasonic vibrator made of a piezoelectric member. In addition, a method of applying thermal compression to hollow glass beads, a method of allowing a molten material to foam and the like are used. These methods are disclosed by, for example, JP 2559144 B.

The acoustic impedances of these materials, however, are larger than $50\times10^4$ kg/m$^2$/s, and a material having a smaller acoustic impedance is necessary for matching with a gas to obtain high sensitivity.

The above-described acoustic matching layer is not limited to a single layer, and it is generally and widely known that the acoustic matching layer preferably is configured with a plurality of layers of materials having different acoustic impedances so that their acoustic impedances are varied gradually between the acoustic impedances of the piezoelectric member as the vibration device and the gas as the emission medium of ultrasonic waves.

It is widely known that to laminate a plurality of acoustic matching layers each having a thickness adjusted to be about ¼ of the emission wavelength of the ultrasonic waves that pass through the acoustic matching layer, where the plurality of layers have different acoustic impedances, is effective for widening a band of the ultrasonic transducer. Preferably, the plurality of matching layers are configured so that their acoustic impedances decreases gradually from the acoustic impedance Z0 of the piezoelectric member to the acoustic impedance Z3 of the gas as the emission medium (Z0>Z3) (See for example "ultrasonic waves handbook" published by Maruzen, Aug. 30, 1999, page 108 and page 115). For example, as shown in FIG. 14A, it can be considered that the density in the acoustic matching layer 10 on the side of the piezoelectric member 3 is increased, whereas that on the side of the gas as the emission medium is decreased.

From the viewpoint of the principles, the acoustic matching layer may be configured with a plurality of layers. However, from the industrial viewpoint, an acoustic matching layer having a double layer structure is effective. That is to say, when consideration is given to the effect from the acoustic matching layer made up of a plurality of layers and an increase in the cost associated with the configuration, the acoustic matching layer having a double layer structure is effective. As an example of the acoustic matching layer configured with two different layers, JP 61(1986)-169100 A, for example, discloses the following: a laminated polymeric porous film is adhered to an ultrasonic wave emission surface of a first matching layer with a low density obtained by solidifying a minute hollow material to form a double layer structure, whereby the acoustic impedance matching can be performed effectively, and at the same time the sensitivity of the ultrasonic transducer can be improved.

In the case of the acoustic matching layer having a double layer structure, as shown in FIG. 14B, an ideal way is to arrange a matching member 11 with a relatively high density as a first layer on the side of the piezoelectric member 3 and arrange a matching member 12 with a relatively low density as a second layer on the side of the gas and to integrate these layers.

As described above, it is known that the acoustic matching layer configured with a plurality of members having different acoustic impedances, especially with two different members (layers), is effective in terms of the principles. However, there are not so many applications of such a configuration.

The inventors of the present invention have conducted a detailed study of the conventional acoustic matching members made up of a plurality of different members. As a result, it was found that the conventional members have the following three problems:

The conventional acoustic matching members often are manufactured by preparing different materials individually and by attaching them or a similar method (e.g., to apply a coating onto a surface). As a result, (1) the bonding face between the layers is weak physically, and therefore delamination becomes likely to occur during transmission and reception of ultrasonic waves due to the vibration, which causes malfunctions of the acoustic matching member and of an ultrasonic transducer and an ultrasonic flowmeter using the same. (2) When attaching different members with a third member such as an adhesive, the acoustic matching member assumes a three layer structure practically. Therefore, it becomes difficult to design the acoustic matching layer optimally. That is to say, the physical properties (density and velocity of sound) of the bonding material as an intermediate layer and the shape after bonding (thickness of the intermediate layer) cannot be ignored, so that the design becomes difficult. Even when the design can be done, the problems of limited options for bonding materials and complicated control of the thickness of the intermediate layer cannot be avoided. (3) The complicated manufacturing method in which different members are prepared individually and are attached results in an increase in the manufacturing cost of the ultrasonic transducer and of an ultrasonic flowmeter.

Especially, when a porous member as the low density member is selected for the attached acoustic matching member on the above-stated grounds of the principles, the bonded surface is not a flat face but many voids are present, which means that the practically effective bonding area is significantly small. Since the adhesion properties decrease with decreases in effective bonding area, the above problem (1) becomes more pronounced.

In addition, even when the bonding can be done, the bonding material used tends to penetrate to the porous member, so that, as shown in FIG. 15, an intermediate layer 13 as a locally formed high density portion would be generated at a portion to which the adhesive penetrates. Since this intermediate layer 13 is generated from the impregnation of voids of the porous member with the adhesive, this layer necessarily has a higher density than the first layer 11 and the second layer 12. As a result, the configuration deviates from the above-stated ideal configuration "to configure with a plurality of matching layers so that their acoustic impedances decreases gradually from the acoustic impedance Z0 of the piezoelectric member to the acoustic impedance Z3 of the gas as the emission medium (Z0>Z3)", thus making the above problem (2) more pronounced. Also in the case where a liquid state material is applied to a porous member as the first layer, followed by drying and curing so as to form the second layer, the generation of an intermediate layer formed by the porous member impregnated with the liquid state material cannot be avoided, and therefore the similar problems would occur. In either case, the above-stated problems (1) and (2) become more pronounced.

SUMMARY OF THE INVENTION

Therefore, with the foregoing in mind, it is an object of the present invention to provide an acoustic matching member in which delamination hardly occurs so as to have less malfunction, and an ultrasonic transducer, an ultrasonic flowmeter using the same and methods for manufacturing them.

To fulfill the above-stated object, an acoustic matching member according to the present invention, which may be incorporated into an ultrasonic transducer for transmitting and receiving ultrasonic waves, includes: at least two layers including a first layer and a second layer that have different acoustic impedance values from each other. In this acoustic matching member, the first layer is made of a composite material of a porous member and a filling material supported by void portions of the porous member, the second layer is made of the filling material or the porous member, and the first layer and the second layer are present in this stated order.

An ultrasonic transducer for transmitting and receiving ultrasonic waves according to the present invention includes the above-described acoustic matching member and a piezoelectric member. In this ultrasonic transducer, the piezoelectric member is disposed on a side of the first layer of the acoustic matching member.

An ultrasonic flowmeter according to the present invention includes the above-described ultrasonic transducer. The ultrasonic flowmeter further includes: a measurement tube including a flow path through which fluid to be measured flows, where a pair of the ultrasonic transducers is disposed in the measurement tube on an upstream side and a downstream side relative to the flow of the fluid to be measured so as to oppose each other; a transmission circuit for causing the ultrasonic transducers to transmit ultrasonic waves; a reception circuit for processing ultrasonic waves received by the ultrasonic transducers; a transmission/reception switching circuit for switching between transmission and reception of the pair of ultrasonic transducers; a circuit for measuring a time for ultrasonic waves to propagate between the pair of ultrasonic transducers; and a calculation unit that converts the propagation time into a flow rate of the fluid to be measured.

A first method for manufacturing an acoustic matching member according to the present invention, where the acoustic matching member includes at least two layers including a first layer and a second layer that have different acoustic impedance values from each other, the first layer is made of a composite material of a porous member and a filling material supported by void portions of the porous member, the second layer is made of the filling material or the porous member, and the first layer and the second layer are present in this stated order, includes the steps of.

(a) filling voids of a porous member with a fluid filling material whose volume after solidification is not less than a volume of the voids of the porous member; and (b) solidifying the fluid filling material inside of the voids and the surplus fluid filling material at the same time.

A second method for manufacturing an acoustic matching member according to the present invention, where the acoustic matching member includes at least two layers including a first layer and a second layer that have different acoustic impedance values from each other, the first layer is made of a composite material of a porous member and a filling material supported by void portions of the porous member, the second layer is made of the filling material or the porous member, and the first layer and the second layer are present in this stated order, includes the steps of:

(a) filling at least one portion of voids of a porous member with a fluid filling material; and (b) solidifying the fluid filling material inside of the voids.

A first method for manufacturing an ultrasonic transducer according to the present invention, where the ultrasonic transducer for transmitting and receiving ultrasonic waves includes the above-described acoustic matching member and a piezoelectric member, includes the step of attaching a side of the first layer of the acoustic matching member to a surface of the piezoelectric member or to an outer surface of a closed container at a position opposed to a disposed position of the piezoelectric member.

A second method for manufacturing an ultrasonic transducer according to the present invention, where the ultrasonic transducer for transmitting and receiving ultrasonic waves includes the above-described acoustic matching member and a piezoelectric member, includes the steps of.

(a) attaching the porous member that does not contain the filling material to a surface of the piezoelectric member or to an outer surface of a closed container at a position opposed to a disposed position of the piezoelectric member; and (b) then filling the porous member with a fluid filling material and solidifying the fluid filling material.

DETAILED DESCRIPTION OF THE INVENTION

An acoustic matching member of the present invention includes at least two layers including a first layer and a second layer that have different acoustic impedance values from each other. The first layer is made of a composite material of a porous member and a filling material supported by void portions of the porous member, and the second layer is made of the filling material or the porous member. Therefore, substances with desired acoustic impedance values can be combined. In addition, the first layer and the second layer are continuous in their materials so as to be integrated, so that delamination between the layers hardly occurs and the acoustic matching member has less malfunction. Further, in the absence of an adhesive or the like, bubbles are not included between the layers, and a phenomenon in which an adhesive is absorbed in the porous member does not occur.

Any intermediate layers, which are the cause of the above-described problems, are not present physically, so that a matching member having the ideal structure can be configured and the designing of the same can be done easily.

It is preferable to have a configuration in which the first layer is made of a composite material of the porous member and the filling material, and the second layer is made of a filling material, which has continuity with the filling material of the first layer. Alternatively, it is preferable to have a configuration in which the first layer is made of a composite material of the porous member and the filling material, and the second layer is made of a porous member, which has continuity with the porous member of the first layer.

It is preferable to embody the acoustic matching member according to the present invention as follows:

Firstly, the first layer and the second layer may be configured so that an acoustic impedance Z1 of the first layer and an acoustic impedance Z2 of the second layer have the following relationship:

$$Z1>Z2.$$

Secondly, the first layer and the second layer may be configured so that an apparent density ρ1 of the first layer and an apparent density ρ2 of the second layer have the following relationship:

$$\rho 1>\rho 2.$$

Thirdly, at least one of the porous member and the filling material may be made of an inorganic substance.

Fourthly, the porous member may be a sintered porous member of ceramic or a mixture of ceramic and glass.

Fifthly, the filling material may be a dry gel made of an inorganic oxide.

Additionally, the closed container of the ultrasonic transducer according to the present invention preferably is made of a metal material.

The following describes embodiments of the present invention in detail, with reference to the drawings.

Embodiment 1

Figure 1:
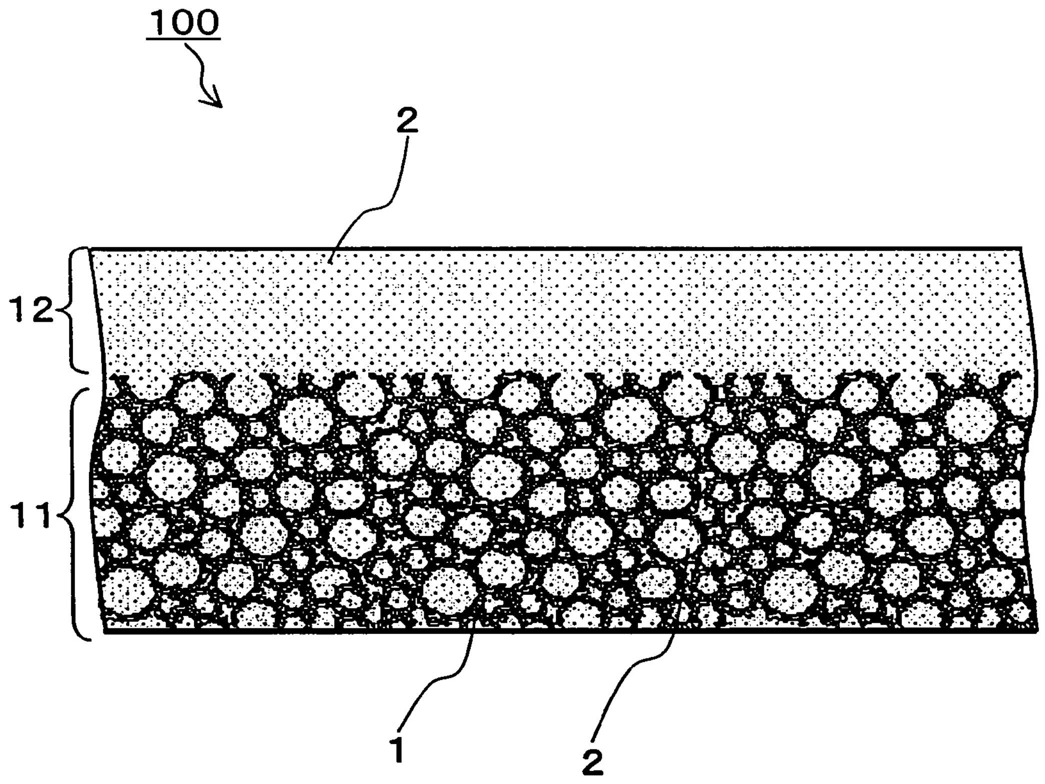
FIG. 1 is a cross-sectional view schematically showing an acoustic matching member according to Embodiment 1 of the present invention.

Embodiment 1 of the present invention is an acoustic matching member 100 made up of a first layer 11 and a second layer 12 as shown in FIG. 1. The first layer 11 is a composite material made up of a porous member 1 and a filling material 2, where a void portion of the porous member 1 is impregnated with the filling material, and the filling material is cured therein and supported by the void portion. The second layer 12 is made of the same material as the filling material in the first layer. There exists at least one continuously integrated portion between the filling material in the first layer 11 and the material of the second layer 12. That is to say, the filling material 2 making up the second layer 12 and the filling material 2 in the first layer 11 are formed by solidifying simultaneously, so that they have physical continuity.

The filling material 2 making up the second layer 12 penetrates through the interior of the void portions of the porous member in the first layer 11 and is cured therein. As a result, the first layer 11 and the second layer 12 are bonded strongly because of the effects from the physical shape (anchor effects), and there is no layer (intermediate layer) between the first layer 11 and the second layer 12.

Since the acoustic matching member according to the present invention has the above-described configuration, delamination between the two layers making up the acoustic matching member hardly occurs, and the absence of any intermediate layers facilitates the design of the acoustic matching member.

In the above description, at least one portion having continuity means that some discontinuity may be present at one portion due to a crack or the like generated during the manufacturing process.

Embodiment 2

Figure 2:
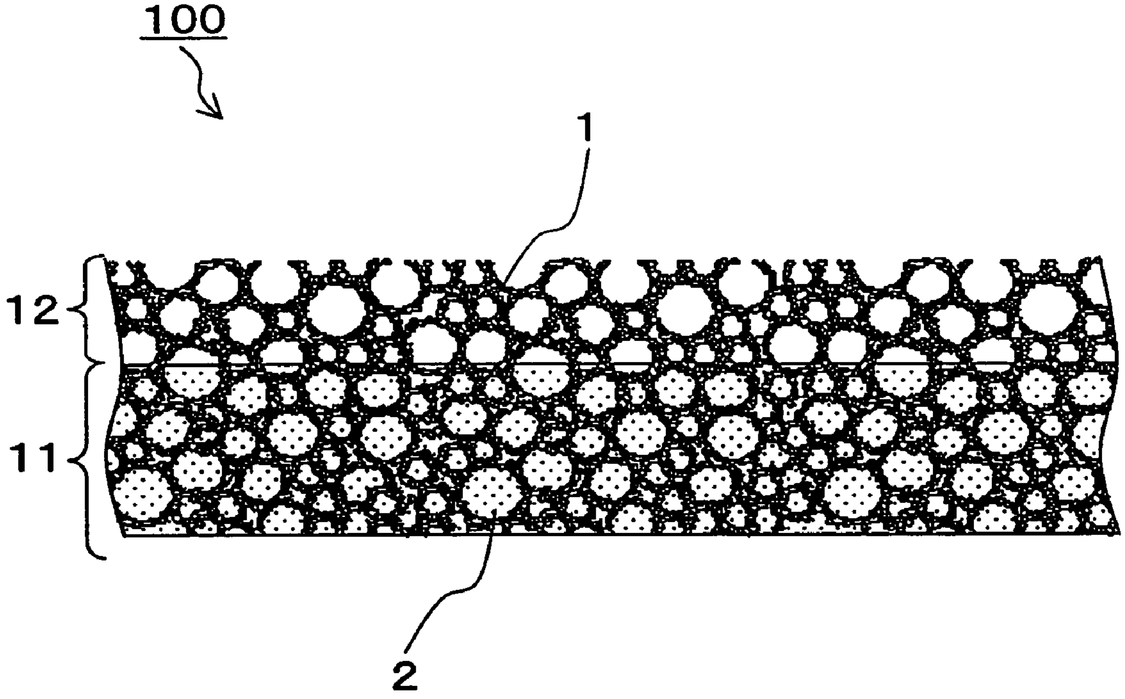
FIG. 2 is a cross-sectional view schematically showing an acoustic matching member according to Embodiment 2 of the present invention.

Embodiment 2 of the present invention is an acoustic matching member 100 made up of two layers including a first layer 11 and a second layer 12 as shown in FIG. 2. The first layer 11 is a composite material made up of a porous member 1 and a filling material 2, where a void portion of the porous member 1 is impregnated with the filling material, and the filling material is cured therein and supported by the void portion. The second layer 12 is made of a portion of the porous member 1 having voids, which makes up the first layer 11. The acoustic matching member according to Embodiment 2 is configured with two layers by filling the lower layer in one porous member 1 with the filling material 2. That is to say, the acoustic matching member has the first layer made of the composite material made up of the skeleton and the void portions of the porous member 1 impregnated with the filling material 2, where the filling material 2 is cured therein, and the second layer made up of only the skeleton of the porous member 1.

In the first layer 11, the void portions of the porous member 1 are impregnated with the filling material 2 so as to be integrated with each other, and the second layer 12 is made of the porous member 1. Therefore, basically, there is no intermediate layer between the both layers. In addition, delamination between the layers hardly occurs, so that the acoustic matching layer having high reliability can be obtained.

Since the acoustic matching member according to the present invention has the above-described configuration, delamination between the two layers making up the acoustic matching member hardly occurs, and the absence of any intermediate layers facilitates the design of the acoustic matching member.

In Embodiments 1 and 2, for reasons of manufacturing, some portions of the voids in the first layer may be kept not being impregnated with the filling material. Although a not-impregnated level is not limited especially, the level less than 10 volume % would not present any problems practically.

Further, in Embodiments 1 and 2, preferably, the first layer and the second layer are configured so that the acoustic impedance Z1 of the first layer and the acoustic impedance of Z2 of the second layer have a relationship of Z1>Z2. In terms of the principles, it is preferable to use a matching layer having a configuration where the acoustic impedance decreases gradually from the acoustic impedance Z0 of the piezoelectric member to the acoustic impedance Z3 of the gas as the emission medium (Z0>Z3).

In addition, in Embodiments 1 and 2, preferably, the first layer and the second layer are configured so that an apparent density ρ1 of the first layer and an apparent density ρ2 of the second layer have a relationship of ρ1>ρ2. Here, the apparent density refers to a value obtained by dividing a weight by a volume including the voids. As shown by the above-stated formula (4), an acoustic impedance is defined as the product of a density and a sound velocity. Therefore, if the sound velocities are at the same level, then a larger apparent density would lead to a larger acoustic impedance. The acoustic matching member, in both of Embodiment 1 and Embodiment 2, is configured with the first layer made of the skeleton and the void portions of the porous member impregnated with the filling material that is cured therein and the second layer made of the filling material or the porous member. Thus, in the acoustic matching member according to the present invention, the apparent density ρ1 of the first layer and the apparent density ρ2 of the second layer always have a relationship of ρ1>ρ2. In terms of the principles, it is preferable to arrange the first layer on the side of the piezoelectric member and the second layer on the side of the emission medium.

Further, in Embodiments 1 and 2, at least one of the porous member and the filling material preferably is made of an inorganic substance. To configure the acoustic matching member with an inorganic oxide having a smaller rate of change in physical properties (density, sound velocity and dimensions) relative to the temperature change than that of organic substances is preferable, because a change in the properties (output and impedance) of an ultrasonic transducer employing such an acoustic matching member would decrease relative to the ambient temperature change. It is particularly preferable to configure both of the porous member and the filling material with inorganic substances.

In Embodiments 1 and 2, it is preferable to configure the porous member with a sintered porous member of ceramic or a mixture of a ceramic and a glass. Although any materials that have voids capable of being impregnated with a filling material and supporting the filling material are applicable as the porous member used in the present invention, in terms of the above-stated stability of the physical properties and moreover the chemical stability (stability against a measured gas), the use of a sintered porous member of ceramic or a mixture of ceramic and glass is preferable. Although they are not limited especially, in terms of the matching with the gas as the emission medium, the porous member preferably has an apparent density from 0.4 g/cm$^3$ to 0.8 g/cm$^3$, and the material of the skeleton preferably is a sintered body of $SiO_2$ powder or $SiO_2$ powder and glass powder.

In addition, in Embodiments 1 and 2, it is particularly preferable to configure the filling material with a dry gel of an inorganic oxide. When a dry gel is used as the filling material, it is preferable, in terms of the reliability, to adopt a configuration where the solid skeleton portion of the dry gel has hydrophobic properties.

As for the filling material, when voids of the porous member are filled with the filling material, it needs to have a fluidity enabling the impregnation. In addition, after the impregnation, the filling material should have a property of being cured by a certain process (polymerization, heat curing, drying, dehydration and the like) so as to be supported within the voids of the porous member.

High polymeric organic substances, dry gels and the like can be considered as the candidates, and in terms of the acoustic impedance the use of a dry gel of an inorganic oxide is particularly preferable because it has a low apparent density and because the use of an inorganic substance is preferable. Here, the dry gel is a porous member formed through a sol-gel reaction, in which the reaction of a gel raw material fluid allows a skeleton portion to be solidified so as to make up a wet gel containing a solvent, and the wet gel is dried to remove the solvent. This dry gel is a nano-porous member in which a solid skeleton portion in nanometer size forms a series of air holes with an average diameter of minute holes in the range of 1 nm to 100 nm. With this configuration, in a low density state of 0.4 g/cm$^3$ or less, a velocity of sounds propagating through the solid portion becomes extremely low, and a velocity of sounds propagating through a gas portion in the porous member also becomes extremely low because of the minute holes. As a result, the sound velocity becomes 500 m/s or less, which is extremely slow, so that a low acoustic impedance can be obtained. Additionally, since the minute holes in nanometer size make the pressure loss of gas large, the use of them as the acoustic impedance layer allows acoustic waves to be emitted at a high sound pressure. As a material of the dry gel, an inorganic material, a high polymeric organic material and the like can be used, and it is particularly preferable to use a common ceramic obtained by a sol-gel reaction such as silicon oxide (silica) and aluminum oxide (alumina) as a component of the solid skeleton portion of the dry gel of the inorganic oxide.

In Embodiments 1 and 2, the outer diameters of the first layer and the second layer may be different from each other. That is, in the acoustic matching member of the present invention, as long as the acoustic matching member has two layers and satisfies the above-stated requirements for the configuration, the outer diameter of one layer may be larger than those of the other layer.

Furthermore, in Embodiments 1 and 2, in order to enhance the sensitivity of an ultrasonic transducer by matching the acoustic impedances using the acoustic matching member, the thickness of the acoustic matching layer also is a significant factor. That is to say, the transmission strength becomes maximum when the reflectivity of ultrasonic waves becomes minimum where the reflectivity is determined with a consideration given to the reflection coefficients of the ultrasonic waves passing through the acoustic matching layer at a boundary surface between the acoustic matching layer and the emission medium and at a boundary surface between the acoustic matching layer and the ultrasonic vibrator, and when the thickness of the acoustic matching layer is equal to one-fourth of the emission wavelength of the ultrasonic waves. Although the thickness is not limited especially to the following one, to make the thickness of the first layer at about one-fourth of the emission wavelength of the ultrasonic waves passing through the acoustic matching layer is effective for improving the sensitivity. Similarly, to make the thickness of the second layer at about one-fourth of the emission wavelength of the ultrasonic waves passing through the acoustic matching layer also is effective, and to make the thickness of both of the first layer and the second layer at about one-fourth of the wavelength is the most effective. Here, about one-fourth of the emission wavelength of the ultrasonic waves refers to a range from one-eighth to three-eighth of the wavelength. If the thickness is smaller than this range, this layer will not function as the acoustic matching layer, and if the thickness is larger than the range, the sensitivity will be adversely decreased because the thickness will become closer to the half of the wavelength where the reflectivity is at the maximum.

Embodiment 3

Figure 3:
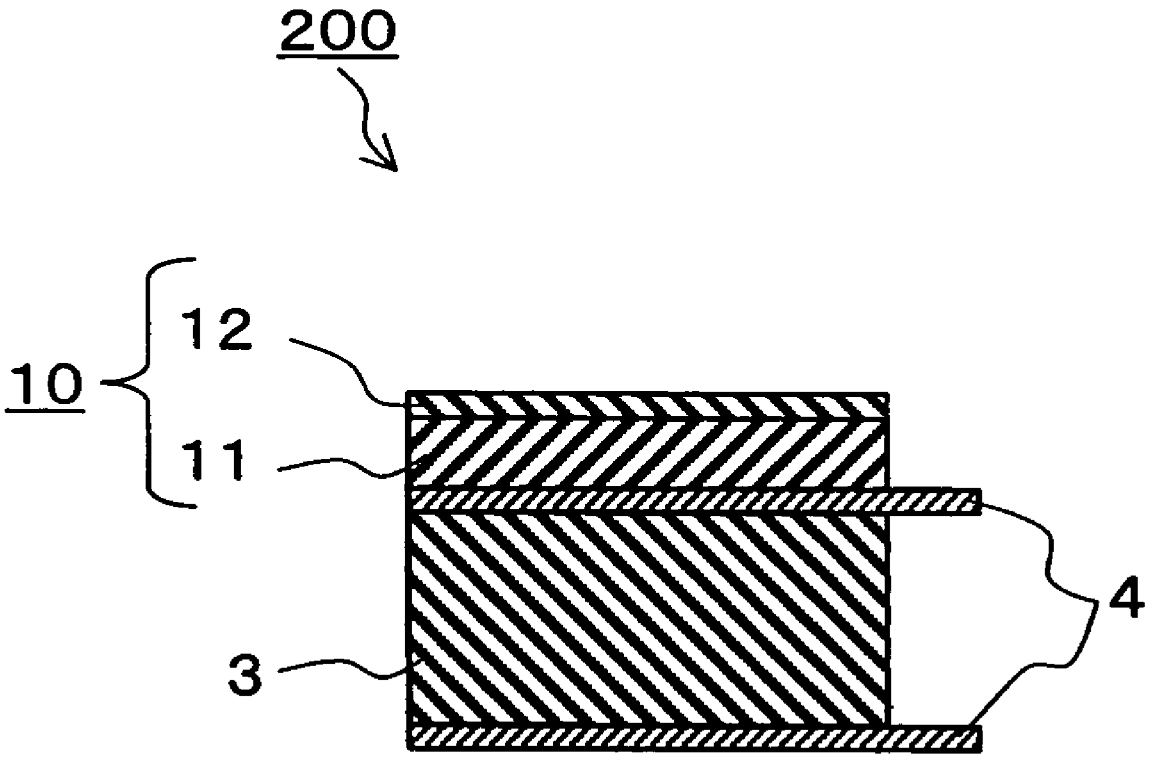
FIG. 3 is a cross-sectional view schematically showing an ultrasonic transducer according to Embodiment 3 of the present invention.

FIG. 3 is a cross-sectional view showing an ultrasonic transducer according to Embodiment 3 of the present invention. An ultrasonic transducer 200 in FIG. 3 is made up of the acoustic matching member 10 described in the above Embodiment 1 or 2 of the present invention, a piezoelectric member 3 and electrodes 4. The acoustic matching member 10, as described above, has a double layered structure including a first layer 11 and a second layer 12, and the piezoelectric member 3 is disposed on the first layer side of the acoustic matching member. The piezoelectric member 3, which generates ultrasonic vibrations, is made of a piezoelectric ceramic, a piezoelectric single crystal or the like. The piezoelectric member 3 is polarized along the thickness direction and has electrodes 4 on the upper and lower surfaces. The acoustic matching member 10 functions so as to transmit ultrasonic waves to a gas or to receive ultrasonic waves that have propagated through a gas, and plays a role of allowing the mechanical vibrations of the piezoelectric member 3 excited by an AC driving voltage to propagate through an outside medium effectively as ultrasonic waves and of allowing the incoming ultrasonic waves to be converted into voltages effectively. The acoustic matching member 10 is formed on one side of the piezoelectric member 3 as a surface of transmitting/receiving ultrasonic waves.

Since the ultrasonic transducer according to this embodiment uses the acoustic matching member having a double layered structure as its acoustic matching layer, the bonding surface between the layers is so strong physically that delamination hardly occurs, and as a result, the ultrasonic transducer with less malfunction can be obtained.

Embodiment 4

Figure 4:
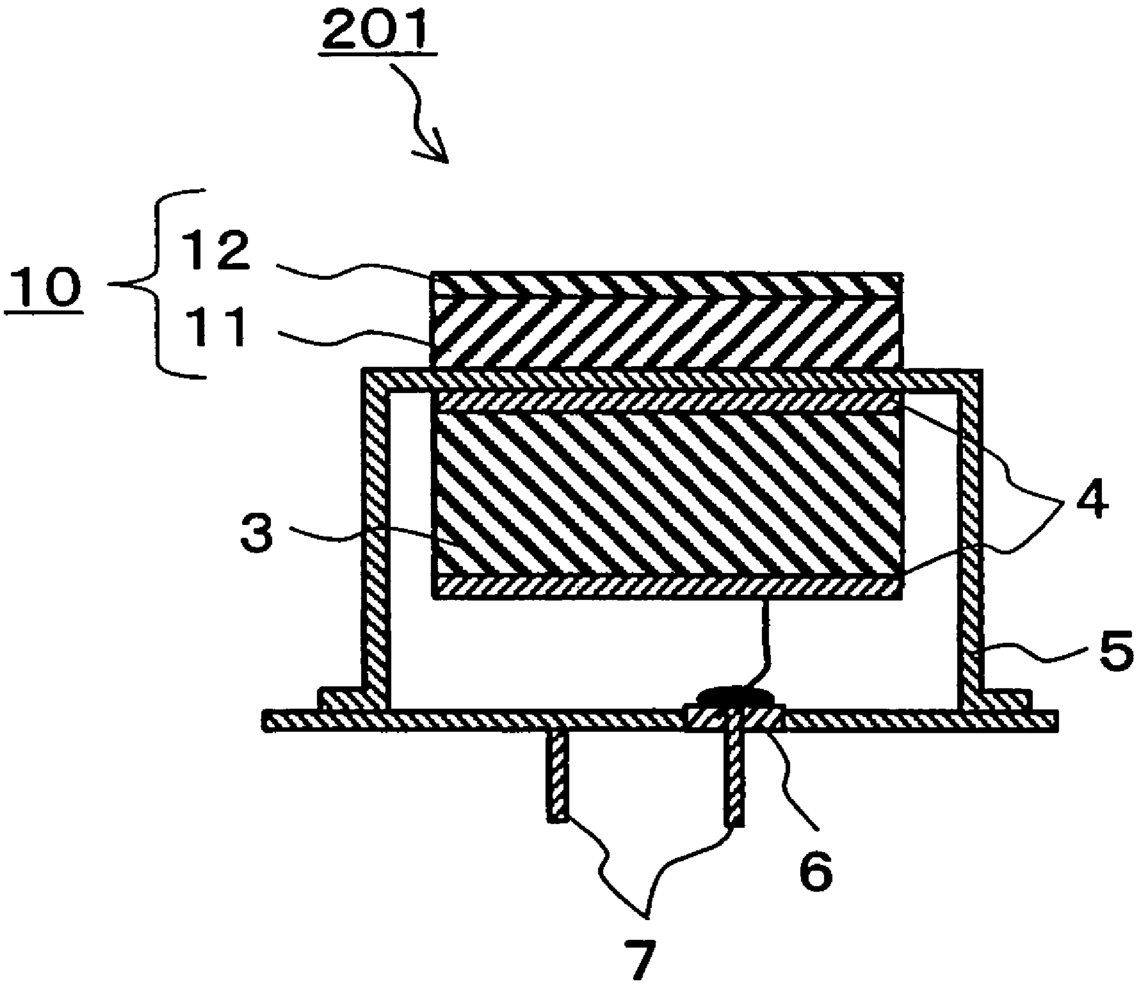
FIG. 4 is a cross-sectional view schematically showing an ultrasonic transducer according to Embodiment 4 of the present invention.

FIG. 4 is a cross-sectional view showing an ultrasonic transducer according to Embodiment 4 of the present invention. An ultrasonic transducer 201 in FIG. 4 is made up of the acoustic matching member 10 described in the above Embodiment 1 or 2 of the present invention, a piezoelectric member 3, electrodes 4, and a dosed container 5.

The piezoelectric member 3, which generates ultrasonic vibrations, is made of a piezoelectric ceramic, a piezoelectric single crystal or the like. The piezoelectric member 3 is polarized along the thickness direction and has electrodes 4 on the upper and lower surfaces. In the ultrasonic transducer of Embodiment 4, the piezoelectric member 3 is disposed in the dosed container 5 and bonded to an inner face of the dosed container 5. The acoustic matching member 10, as described above, has a double layered structure including a first layer 11 and a second layer 12, and the first layer 11 of the acoustic matching member 10 is disposed on an outer surface of the dosed container 5 that is opposed to the disposed position of the piezoelectric member. Reference numeral 7 of FIG. 4 denotes driving terminals, which are respectively connected to the electrodes 4 of the piezoelectric member 3. Reference numeral 6 denotes an insulation seal for securing electrical insulation of the two driving terminals.

The ultrasonic transducer having the configuration of Embodiment 4 is effective in the handling ease due to the provision of the dosed container 5, in addition to the effects from the configuration of the above-described Embodiment 3. In addition, the dosed container 5 has a function of mechanically supporting the configuration.

It is effective that the dosed container 5 has a density of 0.8 $g/cm^3$ or more and the thickness of the layer for supporting the configuration is less than one-eighth of the emission wavelength of ultrasonic waves passing through the layer. When selecting these density and thickness, the layer for supporting the configuration has a large density and therefore the sound velocity becomes large, and the thickness is sufficiently smaller than the emission wavelength of ultrasonic waves. In this case, an influence on the transmission/reception of the ultrasonic waves by the closed container becomes considerably small.

As a material for the closed container 5, an inorganic material such as a metal, ceramic and a glass, and an organic material such as plastic are available. Particularly, when an electrically conducting material, especially a metal material, is selected as the material constituting the dosed container, this material doubles as an electrode for vibrating the piezoelectric member 3 and for detecting the received ultrasonic waves. When flammable gas is to be detected, the dosed container 5 allows the piezoelectric member 3 to be isolated from the gas. It is preferable to purge the inside of the container with an inert gas such as nitrogen.

Embodiment 5

Figure 5:
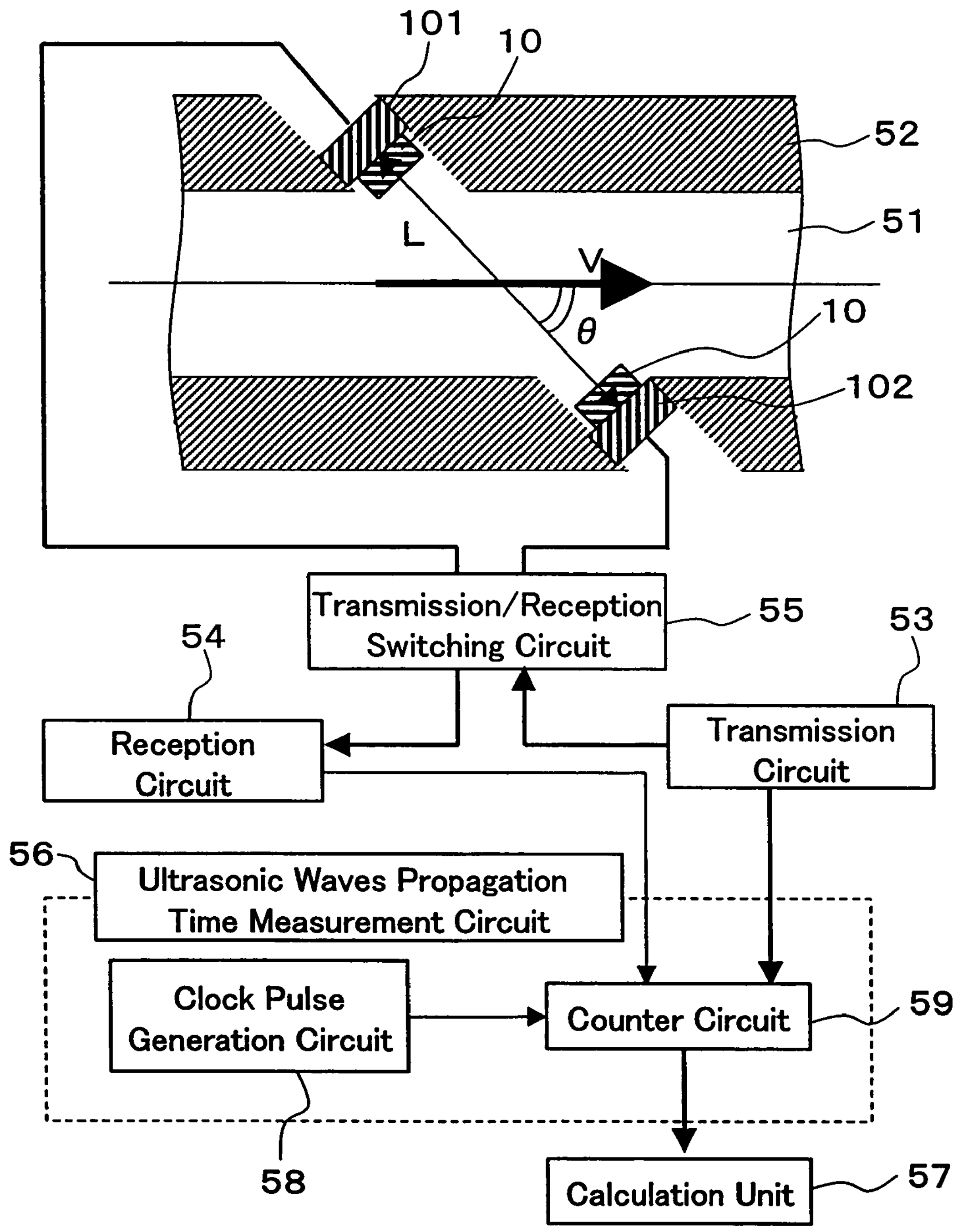
FIG. 5 is a block diagram showing operations by an ultrasonic flowmeter according to Embodiment 5 of the present invention.

FIG. 5 is a cross-sectional view showing one example of an ultrasonic flowmeter according to Embodiment 5 of the present invention and a block diagram of the same. The ultrasonic flowmeter includes: a measurement tube 52 including a flow path 51 through which measured fluid flows; a pair of the above-described ultrasonic transducers 101 and 102 that are disposed so as to oppose each other on the upstream side and the downstream side, respectively, of the flow of the measured fluid, a transmission circuit 53 for causing the ultrasonic transducers to transmit ultrasonic waves; a reception circuit 54 for processing ultrasonic waves received by the ultrasonic transducers; a transmission/reception switching circuit 55 for switching between the transmission and the reception of the pair of the ultrasonic transducers; an ultrasonic waves propagation time measurement circuit 56 that is made up of a counter circuit and a clock pulse generation circuit; and a calculation unit 57 for converting the propagation time into a flow rate of the measured fluid. Reference numeral 58 denotes the clock pulse generation circuit and 59 denotes the counter circuit.

The following describes operations of the ultrasonic flowmeter according to the present invention step by step.

A fluid to be measured, e.g., LP gas, is passed through from left to right on the sheet (the direction indicated by the arrow in the drawing), and a transmission signal is transmitted from the transmission circuit 53 at fixed intervals. The transmitted signal is transferred firstly to the ultrasonic transducer 101 by the transmission/reception switching circuit 55, so as to drive the ultrasonic transducer 101. For instance, the driving frequency is set at about 500 kHz. Ultrasonic waves are transmitted from the driven ultrasonic transducer 101, and the opposed ultrasonic transducer 102 receives the ultrasonic waves. The received signal is input to the reception circuit 54 via the transmission/reception switching circuit 55. The transmission signal (T) from the transmission circuit 53 and the reception signal (R) from the reception circuit 54 are input to the ultrasonic waves propagation time measurement circuit 56 that is made up of the clock pulse generation circuit 58 and the counter circuit 59, where a propagation time t1 is measured. Next, in a converse manner of the measurement of the propagation time t1, by using the transmission/reception switching circuit 55, ultrasonic pulses are transmitted from the ultrasonic transducer 102 and the ultrasonic transducer 101 receives the transmitted ultrasonic pulses, and then the ultrasonic waves propagation time measurement circuit 56 calculates a propagation time t2.

Here, assuming that a distance connecting the centers of the ultrasonic transducers 101 and 102 is L, the sound velocity in the LP gas in a no-wind state is C, the flow velocity in the flow path 51 is V, and an angle between the flow direction of the measured fluid and the line connecting the centers of the ultrasonic transducers 101 and 102 is θ, then the flow velocity V can be determined from the distance L, the angle θ, and the sound velocity C, which are known values, and the measured propagation times t1 and t2, and the flow rate can be determined from the flow velocity V, whereby the flowmeter can be configured.

Embodiment 6

Figure 6A:
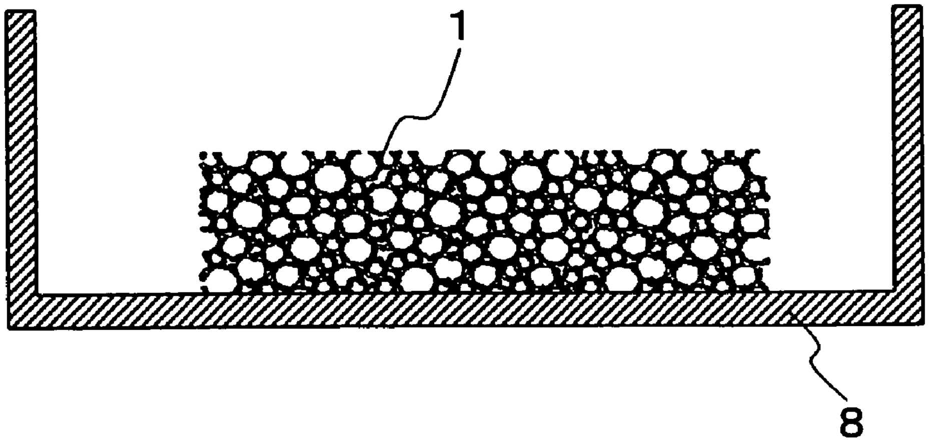
FIGS. 6A to C schematically show a method for manufacturing an acoustic matching member according to Embodiment 6 of the present invention.
Figure 6B:
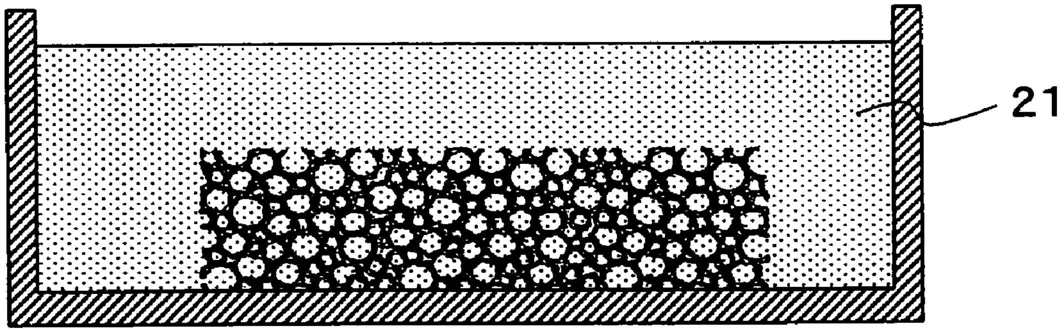
Figure 6C:
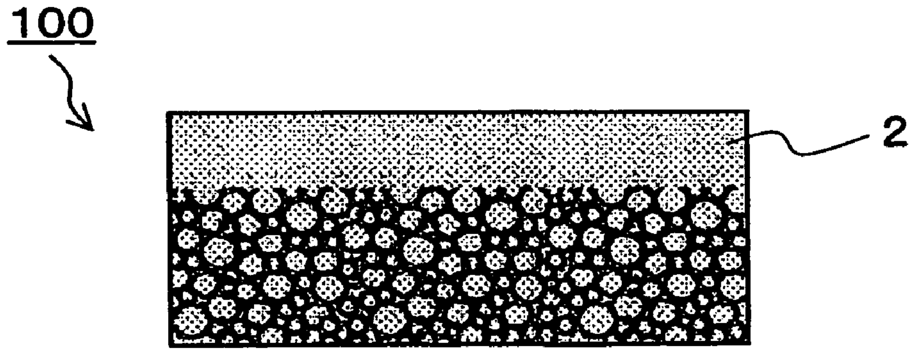

Embodiment 6 shows a method for manufacturing an acoustic matching member, which will be described with reference to FIGS. 6A to 6C. Firstly, a porous member having voids is prepared (FIG. 6A). As the porous member, any one of an inorganic substance, an organic substance and a composite member of an inorganic substance and an organic substance can be used as long as it has holes capable of being filled with a filling material at a later process. However, as previously mentioned, a ceramic porous member is preferable in terms of the acoustic matching. More specifically, such a porous member can be manufactured as follows; mixed powder of ceramic powder and glass powder, organic spheres having an appropriate particle size and an aqueous solution containing a binder resin are stirred and mixed, which is shaped into a desired form, following heat treatment for removing the organic spheres, the binder resin and water, so that a sintered body of the ceramic powder and the glass powder only remains.

Next, a fluid filling material is prepared in the amount not less than a volume of the void portions of the porous member. As shown in FIG. 6B, a porous member 1 is placed in a petri dish or the like as a container 8, and the void portions are filled with the prepared fluid filling material 21.

Next, the fluid fling material within the voids and the surplus fluid fling material are solidified at the same time. Finally, the solidified member is taken out of the container 8 and is shaped into a desired form, so that an acoustic matching member 100 as shown in FIG. 6C can be manufactured.

As for the filling material, when the voids of the porous member are impregnated with the filling material, it needs to have a fluidity enabling the impregnation. In addition, after the impregnation, the filling material should have a property of being cured by a certain process (polymerization, heat curing, drying, dehydration and the like) so as to be supported within the voids of the porous member.

According to the manufacturing method of the present invention, the fluid filling material prior to the solidification with which the void portions are impregnated and the surplus fluid filling material out of the void portions are solidified at the same time. As a result, the acoustic matching member as shown in FIG. 1, which has a double layered structure, can be manufactured where the filling material 2 making up the second layer and the filling material 2 filled in the first layer have the physical continuity. In addition, unlike the conventional manufacturing method in which the first layer and the second layer are manufactured separately and then these layers are bonded with a different material, according to the manufacturing method of the present invention, there are no different layers (intermediate layers) between the first and the second layers, and the design of the layer also can be conducted easily.

In this way, by using the manufacturing method according to Embodiment 6, an excellent acoustic matching member as described in Embodiment 1 can be manufactured easily.

Embodiment 7

Figure 7A:
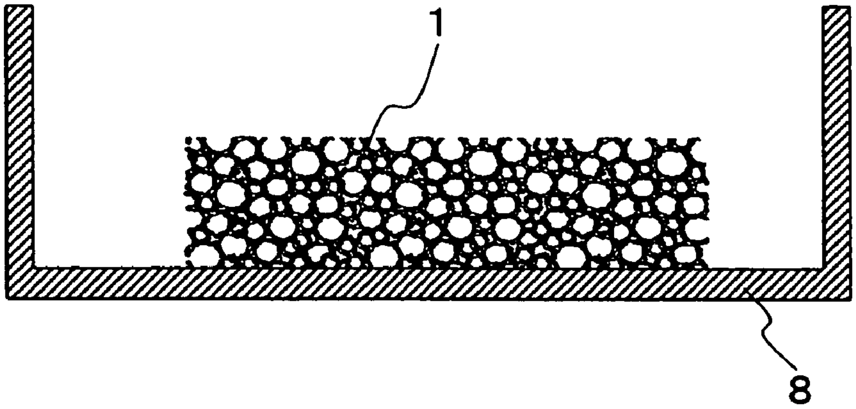
FIGS. 7A to C schematically show a method for manufacturing an acoustic matching member according to Embodiment 7 of the present invention.

Embodiment 7 shows a method for manufacturing an acoustic matching member. This embodiment basically is the same as the above Embodiment 6 in that void portions are filled with a fluid filling material, and then the filling material is solidified to form an acoustic matching member having two layers. Also, the same materials as in Embodiment 6 can be used. This embodiment will be described below, with reference to FIGS. 7A to 7C.

Figure 7B:
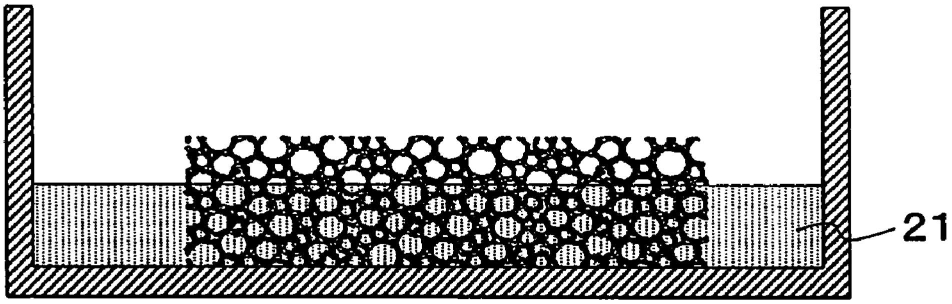
Figure 7C:
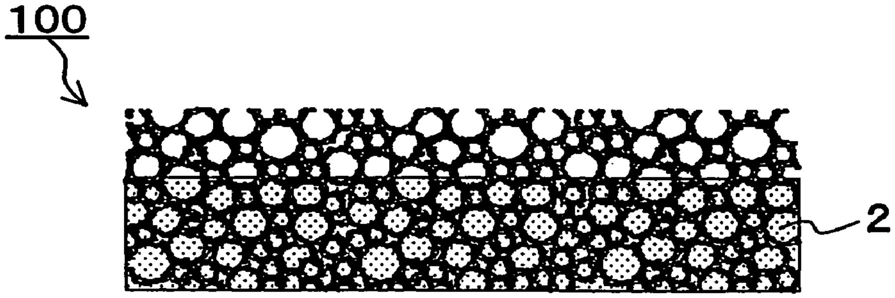

According to the manufacturing method of this embodiment, a porous member 1 having voids is prepared (FIG. 7A) and a fluid filling material 21 is prepared in a similar manner to that in the above Embodiment 6. Next, as shown in FIG. 7B, at least one portion of the voids is filled with the fluid filling material 21, and then the fluid filling material within the voids is solidified. Finally, the solidified member is taken out of the container 8 and is shaped into a desired form, so that an acoustic matching member 100 having the first layer made up of the composite material of the porous member and the filling material and the second layer made up of the porous member only can be manufactured.

As shown in FIG. 2, the first layer of the acoustic matching member obtained by the manufacturing method of the present invention is made up of the composite material of the porous member and the filling material, where the void portions of the porous member are filled with the filling material, which is solidified therein. The second layer is made up of one portion of the porous member of the first layer, and the skeleton of the porous member of the first layer and the skeleton of the porous member constituting the second layer have the continuity. Therefore, according to this manufacturing method, there are no different layers (intermediate layers)

generated between the first and the second layers, so that from the similar grounds described in Embodiment 6, delamination hardly occurs and an acoustic matching member with a high reliability can be obtained as compared with the conventional method in which individual layers are prepared in advance and they are attached to each other, and the design of such a layer can be conducted easily.

In this way, by using the manufacturing method according to Embodiment 7, an excellent acoustic matching member as described in Embodiment 2 can be manufactured easily.

Embodiment 8

Figure 8A:
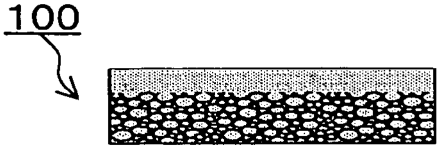
FIGS. 8A to D schematically show a method for manufacturing an ultrasonic transducer according to Embodiment 8 of the present invention.
Figure 8B:
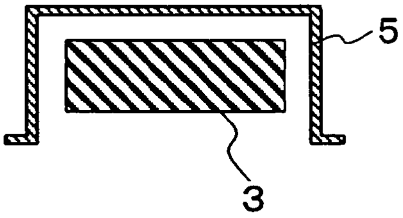
Figure 8C:
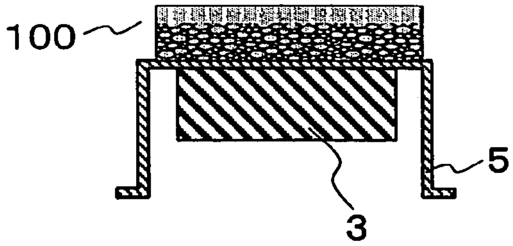

Embodiment 8 shows a method for manufacturing an ultrasonic transducer, which will be described with reference to FIGS. 8A to 8D. Firstly, the acoustic matching member 100 obtained by the manufacturing method of the present invention, a cover portion of a dosed container 5 and a piezoelectric member 3 are prepared (FIGS. 8A and 8B), and the first layer side of the acoustic matching member is attached to a surface of the piezoelectric member or to an outer surface of the dosed container that is opposed to the disposed position of the piezoelectric member (FIG. 8C). Although a method for the attachment is not limited especially, it is preferable to use an epoxy based resin adhesive or an epoxy based resin sheet material, which is applied or disposed between the dosed container 5, the piezoelectric member 3 and the acoustic matching member, followed by the application of pressure and heat so as to be cured and bonded. Finally, by forming a desired wiring and driving terminals, an ultrasonic transducer 201 as shown in FIG. 8D can be manufactured.

Figure 8D:
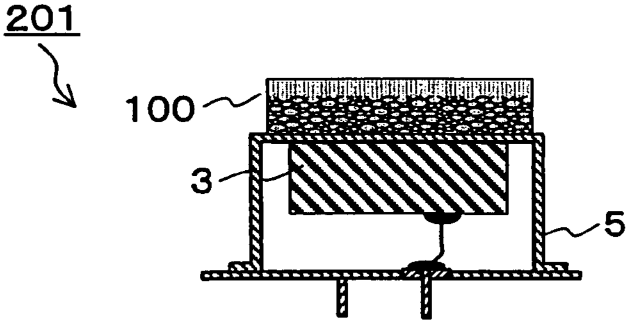

Although FIG. 8D shows a case of using the dosed container, the first layer side of the acoustic matching member may be attached directly to the piezoelectric member. In such a case, the ultrasonic transducer as shown in FIG. 3 can be manufactured.

According to this manufacturing method, since the acoustic matching member having a double layered structure is used as the acoustic matching layer, the bonding surface between the layers is so strong physically that delamination hardly occurs, and as a result, the ultrasonic transducer with less malfunction can be obtained.

Embodiment 9

Embodiment 9 shows another method for manufacturing an ultrasonic transducer, which will be described with reference to FIGS. 9A to 9E.

Figures 9A, 9B, 9C, 9D, 9E:
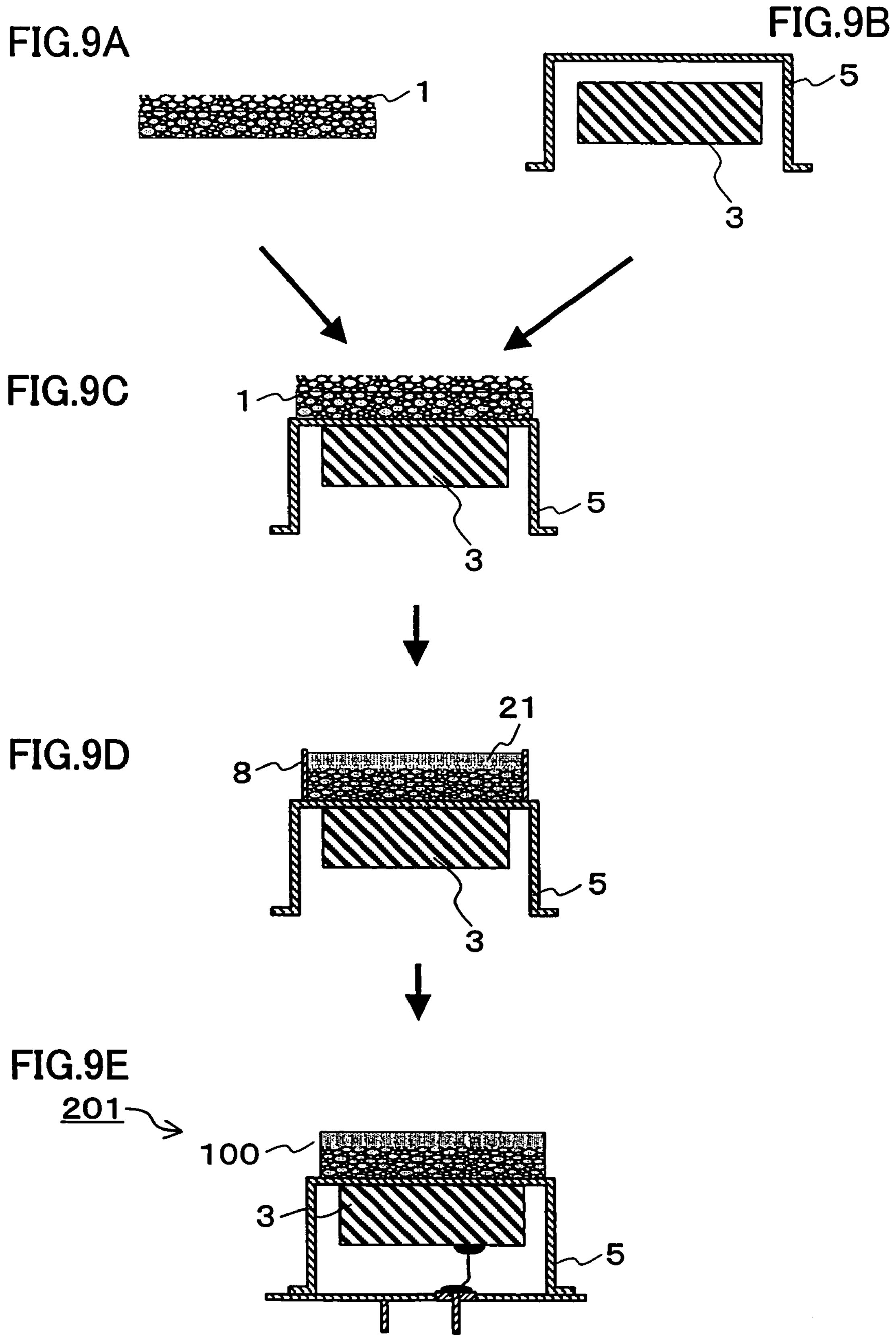
FIGS. 9A to E schematically show a method for manufacturing an ultrasonic transducer according to Embodiment 9 of the present invention.

According to this manufacturing method, firstly as shown in FIGS. 9A and 9B, only a porous member 1 that does not include a filling material is prepared, and is attached to a surface of the piezoelectric member 3 or to an outer surface of the dosed container 5 that is opposed to the disposed position of the piezoelectric member (FIG. 9C). Next, void portions of the porous member are filled with a fluid filling material 21, which is then solidified (FIG. 9D), so as to obtain an ultrasonic transducer 201 integrally including an acoustic matching member 100 (FIG. 9E).

A container 8 of FIG. 9D is for supporting the fluid filling material 21 prior to solidification when forming the filling material, so as not to prevent the filling material from flowing, and therefore it is preferable to remove the container 8 from the finished product. However, in order to enhance the mechanical strength of the ultrasonic transducer, the container may remain in the finished product.

This manufacturing method is effective for improving the productivity when a material having a low apparent density and a low mechanical strength after solidification is selected as the filling material. That is to say, according to this manufacturing method, the porous member whose mechanical strength is larger than that of the filling material after solidification is bonded to the dosed container or the piezoelectric member in advance, and finally the filling material having a relatively low mechanical strength is formed. As described in Embodiment 8, the use of an epoxy based resin adhesive is preferable for bonding of the matching member and the like, and the application of pressure is essential for securing an adequate adhesion. Especially in the case of the acoustic matching member shown in FIG. 1 where the filling material 21 is exposed from the surface on the emission medium side for ultrasonic waves, during the application of pressure for bonding, the filling material might collapse, which makes it difficult to manufacture the ultrasonic transducer. On the other hand, according to the manufacturing method of the present invention, since the filling material is formed after the bonding of the member, pressure is not applied after the formation of the filling material. Therefore, the ultrasonic transducer can be manufactured easily.

According to the acoustic matching member of the present invention, although it is configured with a plurality of layers, there is no independent intermediate layer between the layers, so that delamination between layers hardly occurs and the difficulty in the designing associated with the presence of intermediate layers can be avoided. In addition, according to the manufacturing method of the present invention, the above-described acoustic matching member can be manufactured easily, and therefore the manufacturing cost can be reduced.

Furthermore, the ultrasonic transducer and the ultrasonic flowmeter that employ the acoustic matching member of the present invention can realize favorable properties and have less malfunction by virtue of the acoustic matching member of the present invention having the above-described properties. Moreover, according to the present invention, their manufacturing method is simple, so that an increase in the manufacturing cost associated with the complexity of the manufacturing method can be suppressed.

EXAMPLES

The following describes specific examples of the present invention.

Example 1

In Example 1, the acoustic matching member described in Embodiment 1 and the ultrasonic transducer described in Embodiment 4 were manufactured by the manufacturing methods described in the above Embodiment 6 and Embodiment 9, which will be described below, mainly referring to FIGS. 9A to 9E.

(1) Formation of Porous Member

As a material for forming the skeleton of the porous member, $SiO_2$ powder with an average particle diameter of 0.9 μm and CaO—BaO—$SiO_2$ based glass frit with an average particle diameter of 5.0 μm were mixed at a weight ratio of 1:1, which was milled with a ball mill into ceramic mixed powder with an average particle diameter of 0.9 μm. The obtained ceramic mixed powder and minute spheres made of acrylic resin ("Chemisnow"; trade name produced by Soken Chemical & Engineering Co., Ltd.) were mixed at a volume ratio of 1:9. Then, a binder containing polyvinyl alcohol as a main component was added thereto, followed by kneading so as to manufacture granulation powder with a particle diameter of 0.1 to 1 mm. The granulation powder was put in a disk molding press jig, followed by the application of the pressure at 10,000 N/$cm^2$ for 1 minute so as to obtain a dry molded disk with a diameter of 20 mm and a thickness of 2 mm. Next, this dry disk was subjected to heat treatment at 400° C. for 4 hours for baking and removing the acrylic resin spheres and the binder, followed by baking at 900° C. for 2 hours so as to obtain a ceramic porous member as the porous member 1. The thus obtained ceramic porous member had an apparent density of 0.65 g/$cm^3$ and a void content of 80 volume %, which realized the sound velocity of 1800 m/sec that equaled an acoustic impedance of about $1.2\times10^6$ kg/$m^3$sec. The obtained porous member was ground and adjusted to have a diameter of 12 mm and a thickness of 0.85 mm.

(2) Piezoelectric Member and Container

Electrodes were formed on upper and lower surfaces of a lead zirconate titanate (PZT) ceramic member having a desired size, which was polarized to form a vibrator. The thus obtained vibrator was used as the piezoelectric member 3. A stainless case made of stainless steel was prepared as the closed container 5.

(3) Bonding of Porous Member

The obtained ceramic porous member as the porous member 1, the stainless case as the closed container 5 and the vibrator as the piezoelectric member 3 were arranged with an epoxy based resin adhesion sheet (product number; T2100 produced by Hitachi Chemical Co., Ltd.) having a thickness of 25 μm interposed therebetween and were laminated as shown in FIG. 9C. Then, a load at 100 N/$cm^2$ was applied thereto from the upper and lower directions in the drawing, followed by the application of heat at 150° C. for 2 hours to allow the layers to be bonded and integrated.

(4) Formation of Filling Material

At the acoustic matching layer portion of the thus bonded and integrated member, a ring made of polytetrafluoroethylene with an internal diameter of 12 mm, a height of 1.5 mm and a wall thickness of 0.5 mm was fitted as the container 8. Next, about 0.1 $cm^3$ of gel raw material fluid containing tetramethoxysilane, ethanol, and aqueous ammonia solution (0.1 normal solution), which were present in a mol ratio of 1:3:4, was poured as the fluid filling material 21 into the container 8 from above of the ceramic porous member with an attention paid so as not leave air bubbles within the voids of the porous member. Thereafter, the thus poured gel solution as the fluid filling material became gel to be solidified as a silica wet gel. The thus obtained wet gel was subjected to super critical drying in carbon dioxide at 12 MPa and 50° C. so as to form a silica dry gel as the filling material 2. The second layer of the acoustic matching member, i.e., a portion made of the filling material 2 only, had a thickness of 0.085 mm. The silica dry gel alone, i.e., the second layer portion, had a density of 0.2 g/$cm^3$ and a sound velocity of 180 m/s.

(5) Formation of Ultrasonic Transducer

The ring made of polytetrafluoroethylene as the container 8 was removed, and finally the ultrasonic transducer 201 as shown in FIG. 9E was obtained.

As stated above, the ultrasonic transducer according to Example 1, which was obtained from the operations in accordance with the manufacturing method of the above-described Embodiment 9, corresponds to the ultrasonic transducer described in the above Embodiment 4. This ultrasonic transducer uses the acoustic matching member described in the above Embodiment 1, which was obtained in accordance with the manufacturing method of the above Embodiment 6.

Figure 10A:
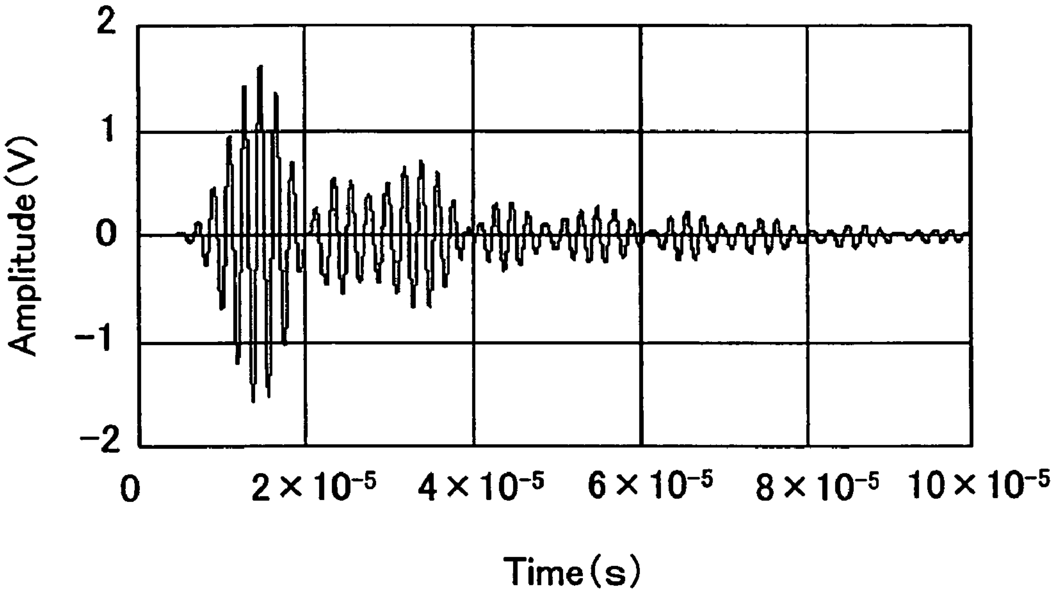
FIG. 10A shows a responsive waveform of an ultrasonic transducer according to Example 1 of the present invention.
Figure 10B:
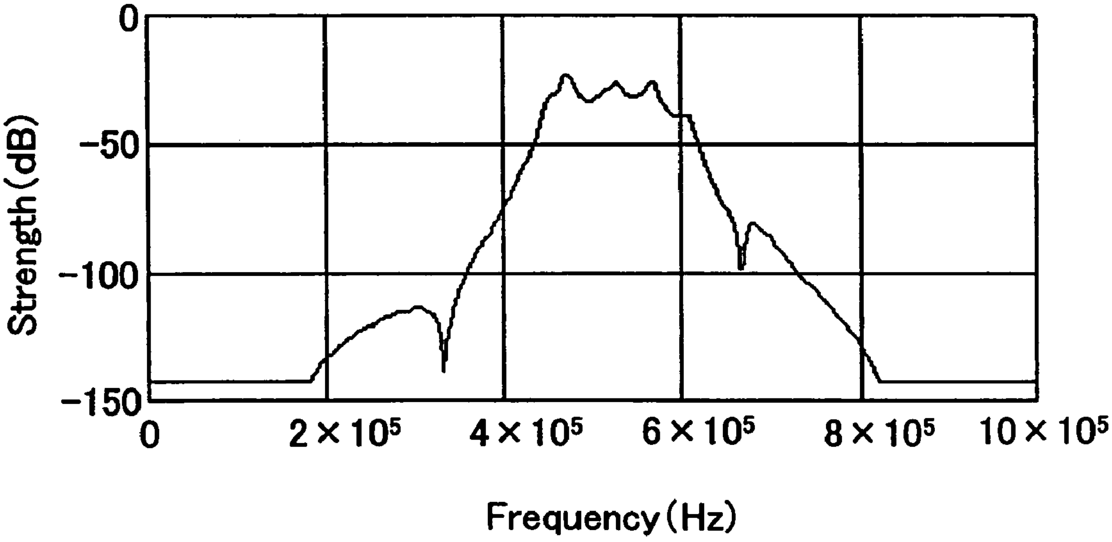
FIG. 10B shows frequency properties of the same ultrasonic transducer.

As for the thus obtained ultrasonic transducer, its transmission/reception properties were estimated for ultrasonic waves at 500 kHz. An ultrasonic flowmeter was formed by opposing a pair of the thus manufactured ultrasonic transducers. Then, when rectangular waves at 500 kHz were sent out from one of the ultrasonic transducers and the other ultrasonic transducer received the rectangular waves, the output waveforms were estimated. FIGS. 10A and 10B show one example of the estimation. FIG. 10A shows a responsive waveform of the ultrasonic transducer of Example 1, which has a sharp rising edge and a suitable waveform for measuring in the application as a flowmeter. FIG. 10B shows the results of the frequency properties, where the ultrasonic transducer having a wide frequency band with its center at 500 kHz could be obtained.

The ultrasonic transducer according to this example, which includes the acoustic matching member configured with two layers, has no intermediate layers between the two layers, so that delamination hardly occurs, and is an excellent ultrasonic transducer that is easy to be designed and manufactured.

Example 2

In Example 2, the acoustic matching member described in Embodiment 2 and the ultrasonic transducer described in Embodiment 4 were manufactured by the manufacturing methods described in the above Embodiment 7 and Embodiment 8, which will be described below, mainly referring to FIGS. 7A to 7C and FIGS. 8A to 8D.

(1) Formation of Acoustic Matching Member

A ceramic porous member, as the porous member 1, was obtained by grinding the porous member, which was obtained by the same manufacturing method described in detail in the above Example 1, to have a thickness of 1.25 mm. The obtained porous member, as shown in FIG. 7A, was disposed in a petri dish made of polytetrafluoroethylene as the container 8, and a portion of the void portion of the ceramic porous member was impregnated with a desired amount of epoxy resin containing a filler (alumina ($Al_2O_3$) powder with an average particle diameter of about 1 μm) as the fluid filling material 21 as shown in FIG. 7B, followed by heating to cure the epoxy resin. The impregnation was conducted under a slightly reduced pressure so as to allow the filling material to flow through the void portions sufficiently for the impregnation. The thermosetting epoxy resin containing a filler alone as the filling material 2 had physical properties of a density of 4.5 g/$cm^3$ and a sound velocity of 2,500 m/s.

Following this, the surplus epoxy resin out of the voids of the ceramic porous member was ground and removed so as to obtain the acoustic matching member 100 in FIG. 2 as described in Embodiment 2 of the present invention.

Through these operations, the acoustic matching member having the first layer made of the composite material made up of the skeleton and the void portions of the porous member 1 impregnated with the filling material 2 that was cured therein and the second layer made up of the skeleton of the porous member 1 only was obtained. The thickness of the first layer was 0.4 mm and the thickness of the second layer was 0.85 mm.

(2) Piezoelectric Member and Container

The same piezoelectric member and the container as described in the above Embodiment 1 were used.

(3) Bonding of Acoustic Matching Member

The obtained acoustic matching member, a stainless case as the closed container 5 and a vibrator as the piezoelectric member 3 were arranged with an epoxy based resin adhesion sheet (product number; T2100 produced by Hitachi Chemical Co., Ltd.) having a thickness of 25 μm interposed therebetween and were laminated as shown in FIG. 8C. Then, a load at 100 $N/cm^2$ was applied thereto from the upper and lower directions in the drawing, followed by the application of heat at 150° C. for 2 hours to allow the layers to be bonded and integrated.

(4) Formation of Ultrasonic Transducer

Finally, an ultrasonic transducer 201 as shown in FIG. 8D was obtained.

As stated above, the ultrasonic transducer according to Example 2, which was obtained from the operations in accordance with the manufacturing method of the above-described Embodiment 8, corresponds to the ultrasonic transducer described in the above Embodiment 4. This ultrasonic transducer uses the acoustic matching member described in the above Embodiment 2, which was obtained in accordance with the manufacturing method of the above Embodiment 7.

Figure 11A:
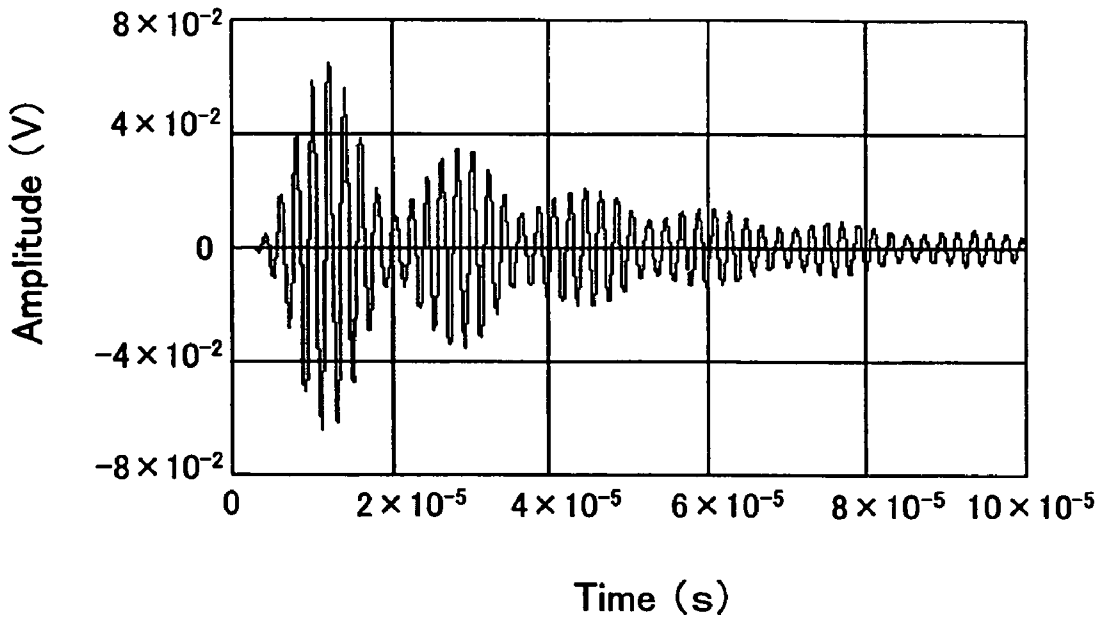
FIG. 11A shows a responsive waveform of an ultrasonic transducer according to Example 2 of the present invention.
Figure 11B:
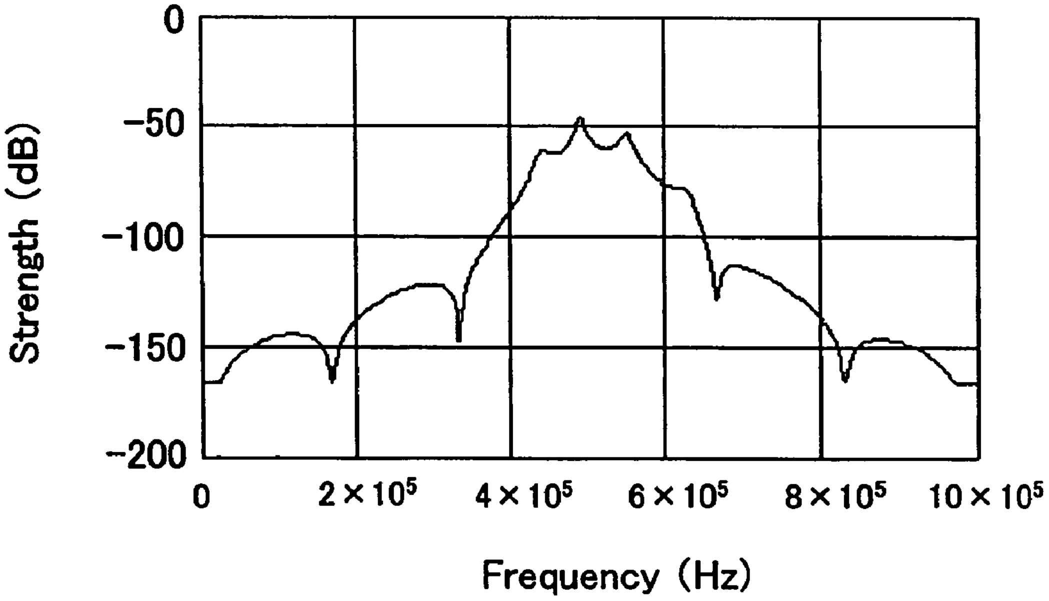
Figure 12:
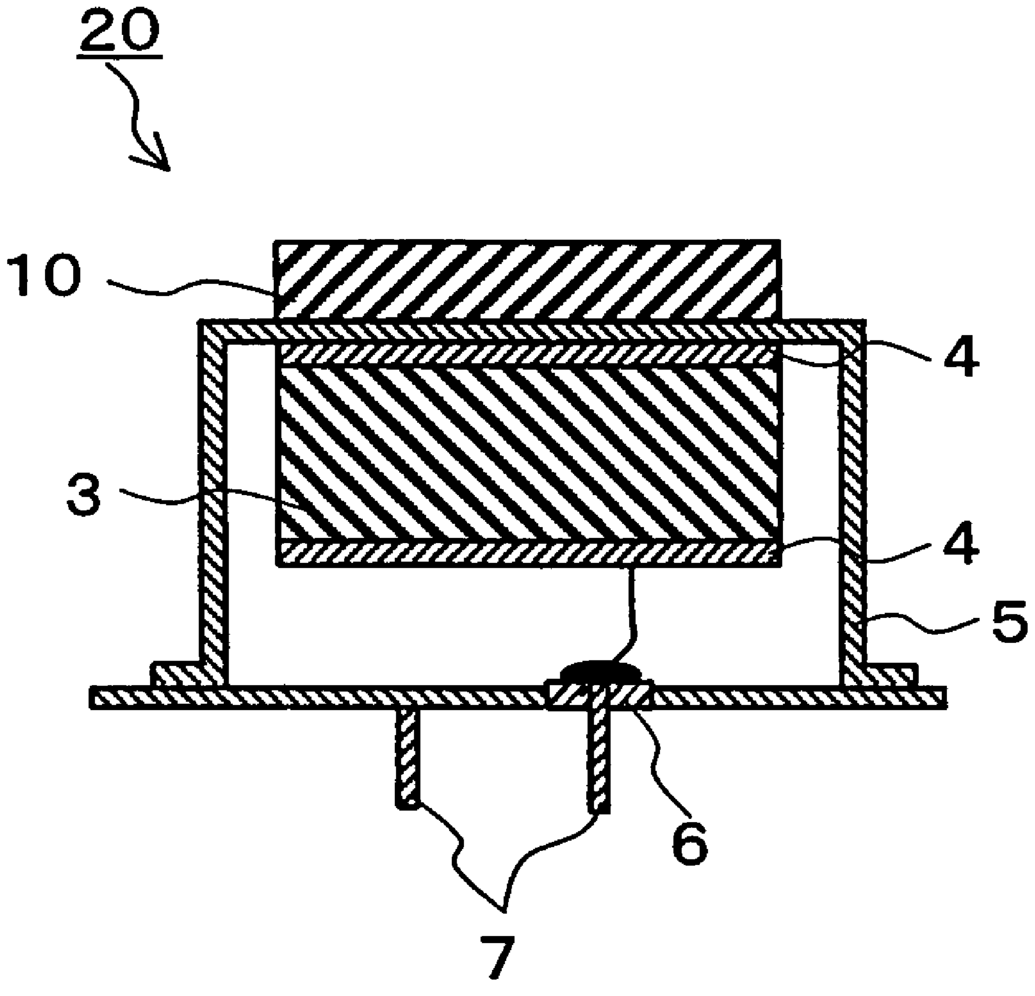
FIG.12 PRIOR ART
FIG. 12 is a cross-sectional view schematically showing a conventional ultrasonic transducer.
Figure 13:
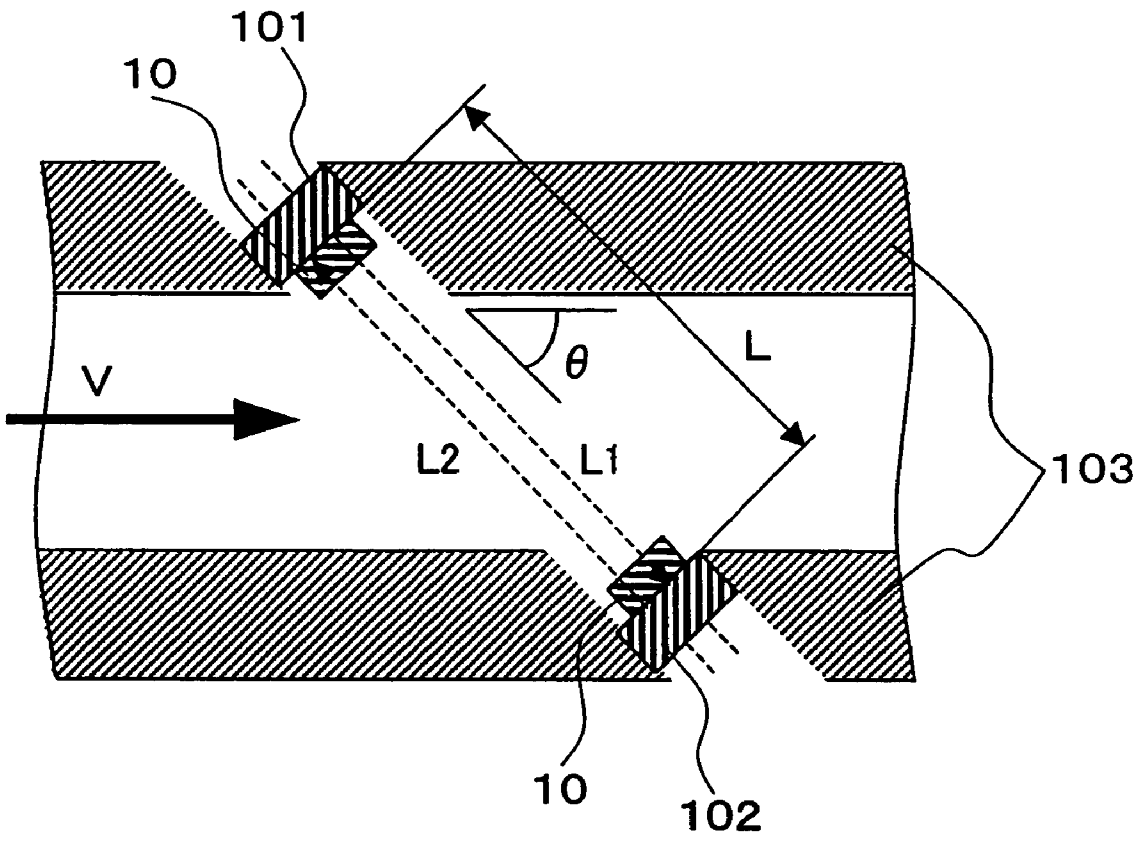
FIG.13 PRIOR ART
FIG. 13 is a diagram for explaining the principles of a conventional ultrasonic flowmeter.
Figure 14A:
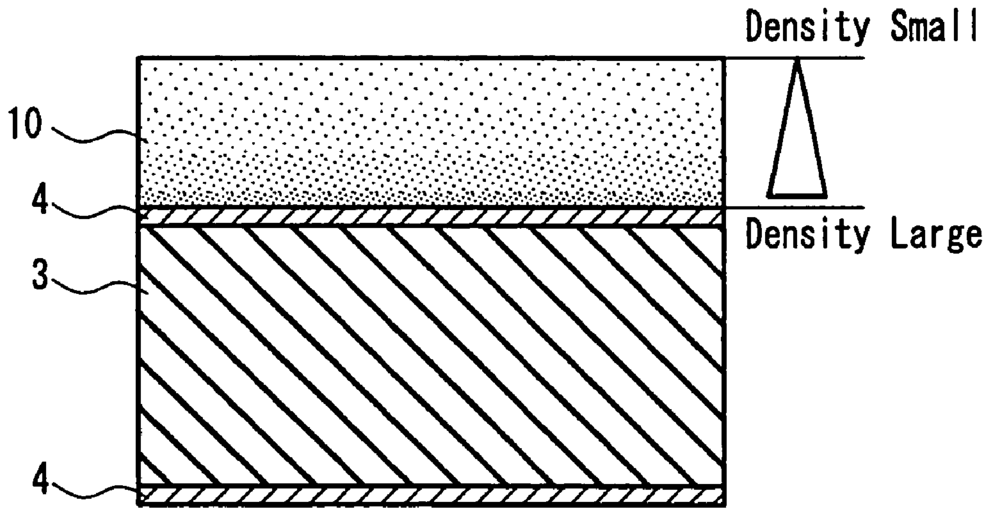
FIG. 14A PRIOR ART
FIG. 14 is a cross-sectional view schematically showing a conventional ultrasonic transducer.
Figure 14B:
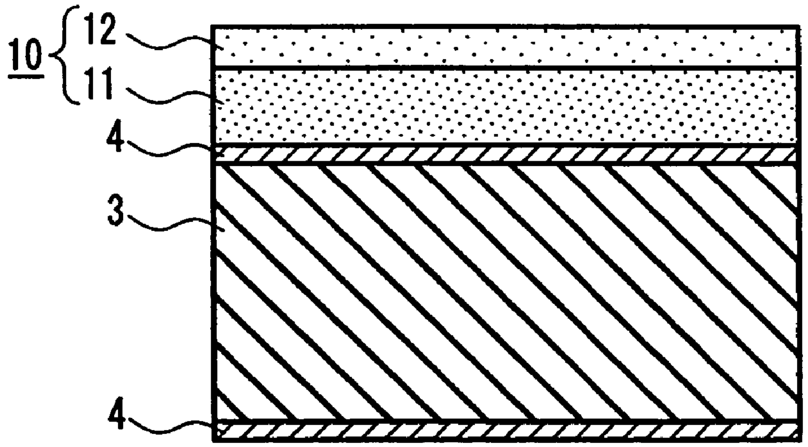
FIG. 14B PRIOR ART
Figure 15:
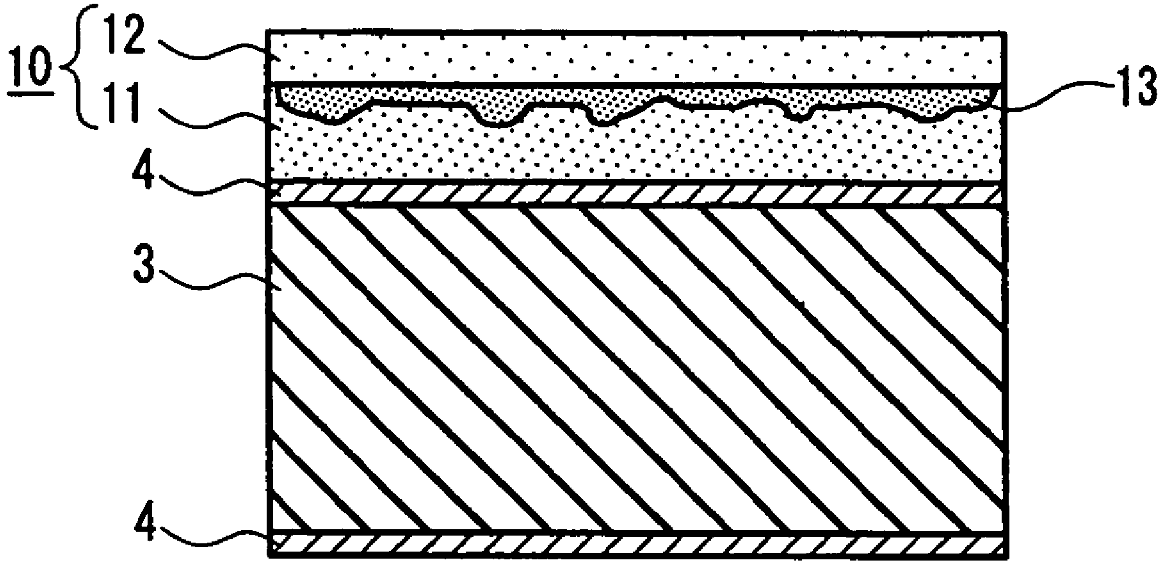
FIG. 15 PRIOR ART
FIG. 15 is a cross-sectional view schematically showing the ultrasonic transducer according to the prior art.

Similarly to the above Example 1, the thus obtained ultrasonic transducer's transmission/reception properties were estimated for ultrasonic waves at 500 kHz. FIGS. 11A and 11B show one example of the estimation. FIG. 11A shows a responsive waveform of the ultrasonic transducer of Example 2, which has a sharp rising edge and a suitable waveform for measuring in the application as a flowmeter. FIG. 11B shows the results of the frequency properties, where the ultrasonic transducer having a wide frequency band with its center at 500 kHz could be obtained.

The ultrasonic transducer according to this Example 2, which uses the acoustic matching member of the present invention made up of two layers like the above Example 1, has no intermediate layers between the two layers, so that delamination hardly occurs and is an excellent ultrasonic transducer that is easy to be designed and manufactured.

Comparative Example 1

Figure 16:
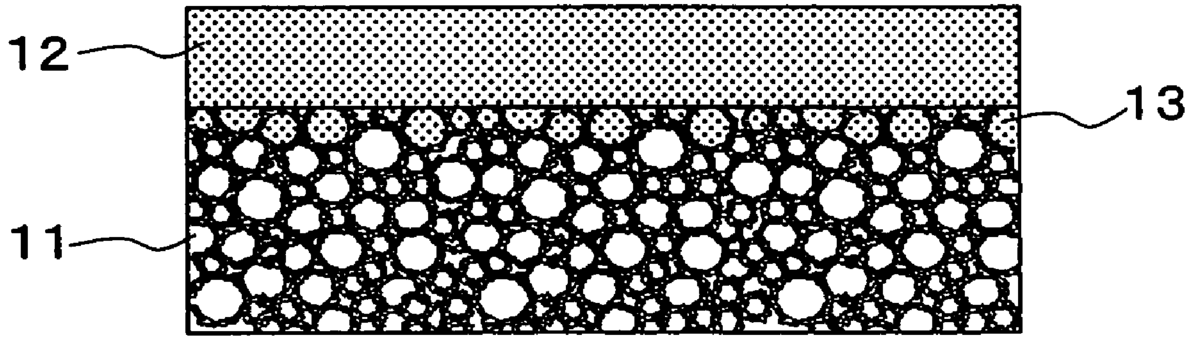
FIG.16 PRIOR ART
FIG. 16 is a cross-sectional view schematically showing the acoustic matching member according to the prior art.

This comparative example shows an example in which an acoustic matching member is manufactured in accordance with the conventional technology, which will be described with reference to FIG. 16.

(1) Formation of a First Layer

As a first layer, a porous member obtained by the same manner as in Example 1 was used. That is to say, a ceramic porous member with an apparent density of 0.65 $g/cm^3$ and a void content of 80 volume % was ground and adjusted to have a diameter of 12 mm and a thickness of 1.2 mm to form the first layer.

(2) Formation of a Second Layer

Similarly to Example 1, a gel raw material fluid containing tetramethoxysilane, ethanol, and aqueous ammonia solution (0.1 normal solution), which were tailored to have a mol ratio of 1:3:4, was allowed to stand in the natural condition at room temperatures for 24 hours to become gel, so as to obtain a wet gel. This wet gel was cut into a size of about 12 mm in diameter and 3 mm in thickness, and was put onto a surface of the ceramic porous member as the first layer, followed by supercritical-drying in carbon dioxide at 12 MPa and 50° C. so as to form a silica dry gel as a second layer.

In accordance with the above method, the manufacturing of an acoustic matching member having a double layer structure including the ceramic porous member as the first layer and the silica dry gel as the second layer was attempted.

In accordance with a similar method, the manufacturing of five acoustic matching members was attempted. However, in three out of the five pieces, the first layer and the second layer were separated after drying or a crack occurred in the second layer, so that acoustic matching members having a double layer structure could not be obtained. It can be considered that this was because the ceramic porous member as the first layer did not have a flat surface, so that a substantially effective bonding area could not be obtained to realize sufficient bonding.

As for the remaining two pieces, when their cross-sectional configuration was observed, an intermediate layer 13 of about 0.050 to 0.100 mm in size, in which the void portions of the porous member were impregnated with the silica dry gel, was found between the first layer 11 and the second layer 12. It can be estimated that this intermediate layer 13 has an apparent density of 0.81 $g/cm^3$ (=0.65+(0.2×0.8)) because this was formed by impregnating the void portions (voidage: 80 volume %) of the porous member having an apparent density of 0.65 $g/cm^3$ with the silica dry gel having an apparent density of 0.2 $g/cm^3$.

Therefore, the apparent density of the intermediate layer was higher than the apparent density $\rho 1$ of the first layer (0.65 $g/cm^3$), which deviated from the previously described ideal configuration, "to configure with a plurality of matching layers so that their acoustic impedances decreases gradually from the acoustic impedance Z0 of the piezoelectric member to the acoustic impedance Z3 of the gas as the emission medium (Z0>Z3)".

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing an acoustic matching member, the acoustic matching member comprising at least two layers including a first layer and a second layer, the method comprising the steps of:

(a) filling voids of a porous member with a fluid filling material to create the first layer;

(b) providing a surplus fluid filling material onto a surface of the porous member to create the second layer;

(c) solidifying the fluid filling material inside the voids and the surplus fluid filling material at the same time;

wherein the porous member and the filling material provide an acoustic matching member having a lower sound velocity than a sound velocity of a vibration device to reduce sound reflections when sound travels between the vibration device and an emission medium.

2. The method for manufacturing the acoustic matching member according to claim 1, wherein the filling material comprises epoxy resin.

3. The method for manufacturing the acoustic matching member according to claim 1, wherein after solidification the density of the second layer is less than the density of the first layer.

4. The method for manufacturing the acoustic matching member according to claim 1, further comprising:

shaping the first layer and the second layer into a desired form after solidification.

5. The method for manufacturing the acoustic matching member according to claim 1, wherein the porous member is a sintered porous member of ceramic or a mixture of ceramic and glass.

6. The method for manufacturing the acoustic matching member according to claim 1, wherein the filling material is a wet gel material that comprises a solvent, and a drying step is conducted to remove the solvent and form a dry gel material.

* * * * *